US010524361B2

(12) United States Patent
Ogawa

(10) Patent No.: US 10,524,361 B2
(45) Date of Patent: Dec. 31, 2019

(54) ELECTRONIC COMPONENT-EMBEDDED SUBSTRATE AND ELECTRONIC COMPONENT DEVICE

(71) Applicant: SHINKO ELECTRIC INDUSTRIES CO., LTD., Nagano-shi, Nagano (JP)

(72) Inventor: Michiro Ogawa, Nagano (JP)

(73) Assignee: SHINKO ELECTRIC INDUSTRIES CO., LTD., Nagano-shi (JP)

(*) Notice: Subject to any disclaimer, the term of this patent is extended or adjusted under 35 U.S.C. 154(b) by 0 days.

(21) Appl. No.: 16/263,196

(22) Filed: Jan. 31, 2019

(65) Prior Publication Data
US 2019/0246502 A1 Aug. 8, 2019

(30) Foreign Application Priority Data
Feb. 2, 2018 (JP) .................................. 2018-017462

(51) Int. Cl.
*H05K 1/18* (2006.01)
*H05K 1/11* (2006.01)
*H05K 1/02* (2006.01)

(52) U.S. Cl.
CPC ........... *H05K 1/185* (2013.01); *H05K 1/0298* (2013.01); *H05K 1/115* (2013.01)

(58) Field of Classification Search
CPC ....... H05K 1/185; H05K 1/0298; H05K 1/115
USPC .......................... 174/260, 262, 258; 361/761
See application file for complete search history.

(56) References Cited

U.S. PATENT DOCUMENTS

| 2007/0053627 | A1* | 3/2007 | Hsu | G02B 6/12002 385/14 |
| 2007/0095471 | A1* | 5/2007 | Ito | H01L 23/5385 156/293 |
| 2012/0080221 | A1* | 4/2012 | Sekine | H05K 1/186 174/260 |
| 2014/0116763 | A1* | 5/2014 | Sato | H05K 1/186 174/258 |
| 2014/0138825 | A1* | 5/2014 | Liu | H05K 1/185 257/738 |
| 2014/0144686 | A1* | 5/2014 | Shimizu | H05K 1/185 174/258 |
| 2015/0014034 | A1* | 1/2015 | Hwang | H05K 3/4697 174/260 |
| 2016/0336258 | A1* | 11/2016 | Liu | H05K 1/185 |

FOREIGN PATENT DOCUMENTS

| JP | 2013-058619 | 3/2013 |
| JP | 2014-107431 | 6/2014 |

* cited by examiner

*Primary Examiner* — Sherman Ng
(74) *Attorney, Agent, or Firm* — Rankin, Hill & Clark LLP

(57) ABSTRACT

An electronic component-embedded substrate includes a first insulation layer having a quadrangular cavity formed therein, and an electronic component arranged in the cavity. The cavity has two adjacent first inner wall surfaces, protrusions protruding inward from the two first inner wall surfaces, respectively, and two adjacent inclined second inner wall surfaces arranged at opposite sides to the two first inner wall surfaces and inclined downward from an outer side toward an inner side. The electronic component is in contact with the protrusions of the cavity.

6 Claims, 21 Drawing Sheets

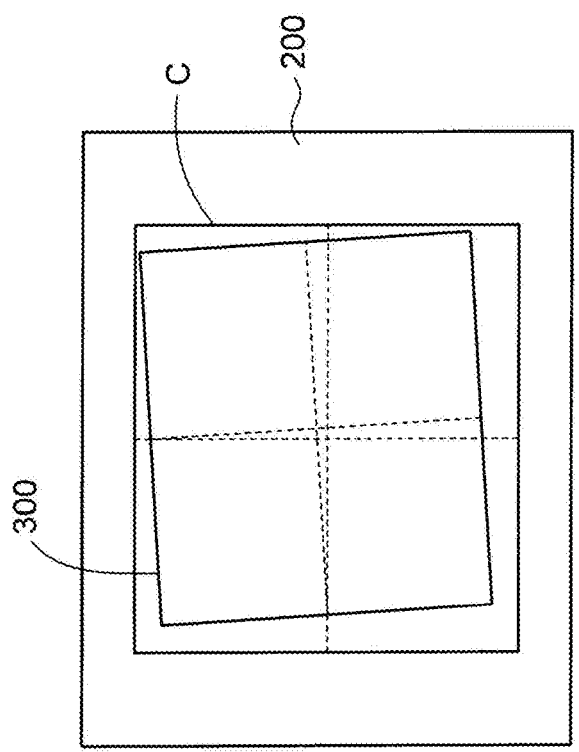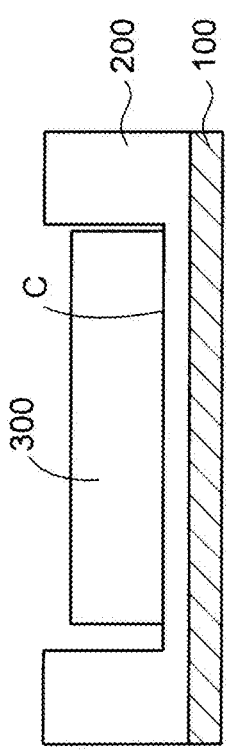
FIG. 2A
FIG. 2B

ELECTRONIC COMPONENT-EMBEDDED SUBSTRATE AND ELECTRONIC COMPONENT DEVICE

CROSS-REFERENCE TO RELATED APPLICATION

The present application claims priority under 35 USC 119 from Japanese Patent Application No. 2018-017462 filed on Feb. 2, 2018.

TECHNICAL FIELD

The present disclosure relates to an electronic component-embedded substrate and an electronic component device.

RELATED ART

In the related art, an electronic component-embedded substrate in which electronic components such as semiconductor chips, capacitors and the like are embedded has been known. In the electronic component-embedded substrate, the electronic components are mounted in cavities formed in an insulation layer of a multi-layered wiring layer, an insulation layer for embedding therein the electronic components is formed, and a wiring layer is connected to the electronic components.

Patent Document 1: JP-A-2013-58619
Patent Document 2: JP-A-2014-107431

As described later in paragraphs of preliminary matters, when a semiconductor chip is arranged with being positionally misaligned in the cavity, a positional relation between a first pad connected to a connection terminal of the semiconductor chip and a second pad connected to the multi-layered wiring layer deviates from the design specification.

For this reason, when connecting connection terminals of another semiconductor chip to the first pad and the second pad, the mutual positions deviate, so that the connection reliability is lowered.

SUMMARY OF INVENTION

Aspect of non-limiting embodiments of the present disclosure relates to provide an electronic component-embedded substrate having a novel structure capable of mounting an electronic component in a cavity with high-position accuracy, and an electronic component device.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided an electronic component-embedded substrate comprising:

a first insulation layer having a quadrangular cavity formed therein; and an electronic component arranged in the cavity, wherein the cavity has:

two adjacent first inner wall surfaces, protrusions protruding inward from the two first inner wall surfaces, respectively, and two adjacent inclined second inner wall surfaces arranged at opposite sides to the two first inner wall surfaces and inclined downward from an outer side toward an inner side, and wherein the electronic component is in contact with the protrusions of the cavity.

According to an aspect of the present disclosure, there is provided a method of manufacturing an electronic component-embedded substrate, the method comprising:

preparing a wiring member having a first insulation layer;

forming a quadrangular cavity in the first insulation layer, the cavity having two adjacent inner wall surfaces, protrusions protruding inward from the two inner wall surfaces, respectively, and two adjacent inclined inner wall surfaces arranged at opposite sides to the two inner wall surfaces and inclined inward and downward, and after the forming the cavity, arranging an electronic component in the cavity; and bringing the electronic component into contact with the protrusions of the cavity by tilting the wiring member.

According to the following disclosure, the first insulation layer of the electronic component-embedded substrate is formed with the quadrangular cavity. The cavity has the two adjacent inner wall surfaces and the protrusions protruding inward from the inner wall surfaces. Also, the cavity has the two adjacent inclined inner wall surfaces provided at the opposite sides to the two inner wall surfaces and inclined inward and downward.

The two inclined inner wall surfaces of the cavity are provided so as to easily mount the electronic component in the cavity. Also, the electronic component is positionally determined with being in contact with the protrusions of the cavity. Thereby, the positional deviation upon the mounting of the electronic component is cancelled and the electronic component is arranged in the cavity with high-position accuracy.

For this reason, the position accuracy of the first pad that is to be connected to the connection terminal of the electronic component is equivalent to the second pad that is to be connected to the wiring layer arranged in the lateral region of the electronic component, so that the mutual positions are matched. Thereby, it is possible to reliably connect connection terminals of a separate electronic component to the first pad and the second pad.

BRIEF DESCRIPTION OF DRAWINGS

Exemplary embodiments of the present invention will be described in detail based on the following figures, wherein:

FIGS. 2A and 2B are a plan view and a sectional view for illustrating the problem of the electronic component-embedded substrate relating to the preliminary matters (2 thereof);

DESCRIPTION OF EMBODIMENTS

Hereinafter, an exemplary embodiment will be described with reference to the accompanying drawings.

Before describing the exemplary embodiment, preliminary matters, which are bases of the present disclosure, are first described. It should be noted that the preliminary matters relate to personal investigation contents of the inventors and include a novel technology, not a known technology.

Figure 1A:
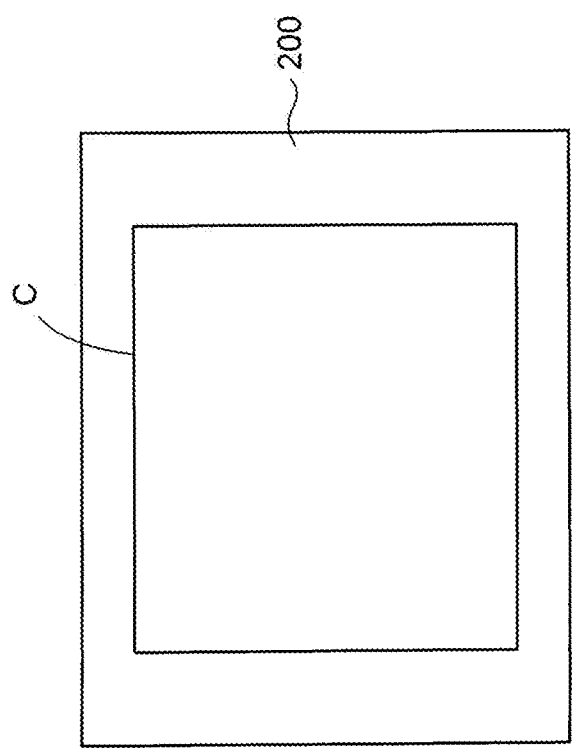
FIGS. 1A and 1B are a plan view and a sectional view for illustrating a problem of an electronic component-embedded substrate relating to preliminary matters (1 thereof)
Figure 1B:
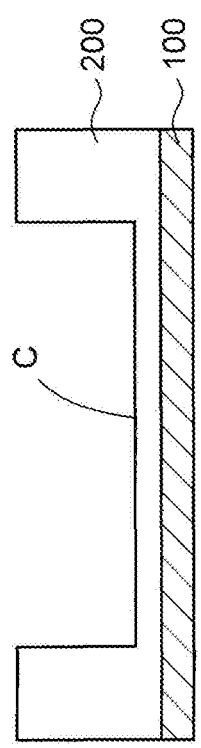

FIGS. 1A to 3 illustrate a problem of an electronic component-embedded substrate relating to the preliminary matters. In a manufacturing method of the electronic component-embedded substrate relating to the preliminary matters, as shown in FIGS. 1A and 1B, an insulation layer 200 is formed on a wiring layer 100 during the manufacturing of a multi-layered wiring layer. Also, a cavity C is formed from an upper surface of the insulation layer 200 to a predetermined thickness by laser processing.

Then, as shown in FIGS. 2A and 2B, a first semiconductor chip 300 sucked to a mounter apparatus (not shown) is positionally aligned and arranged on a bottom surface of the cavity C by image recognizing a positioning mark (not shown).

At this time, the processing precision upon the formation of the cavity C by the laser processing and the positional deviation (X, Y and θ directions) upon the mounting of the first semiconductor chip 300 are combined, so that the first semiconductor chip 300 is arranged with being positionally misaligned in the cavity C.

Figure 3:
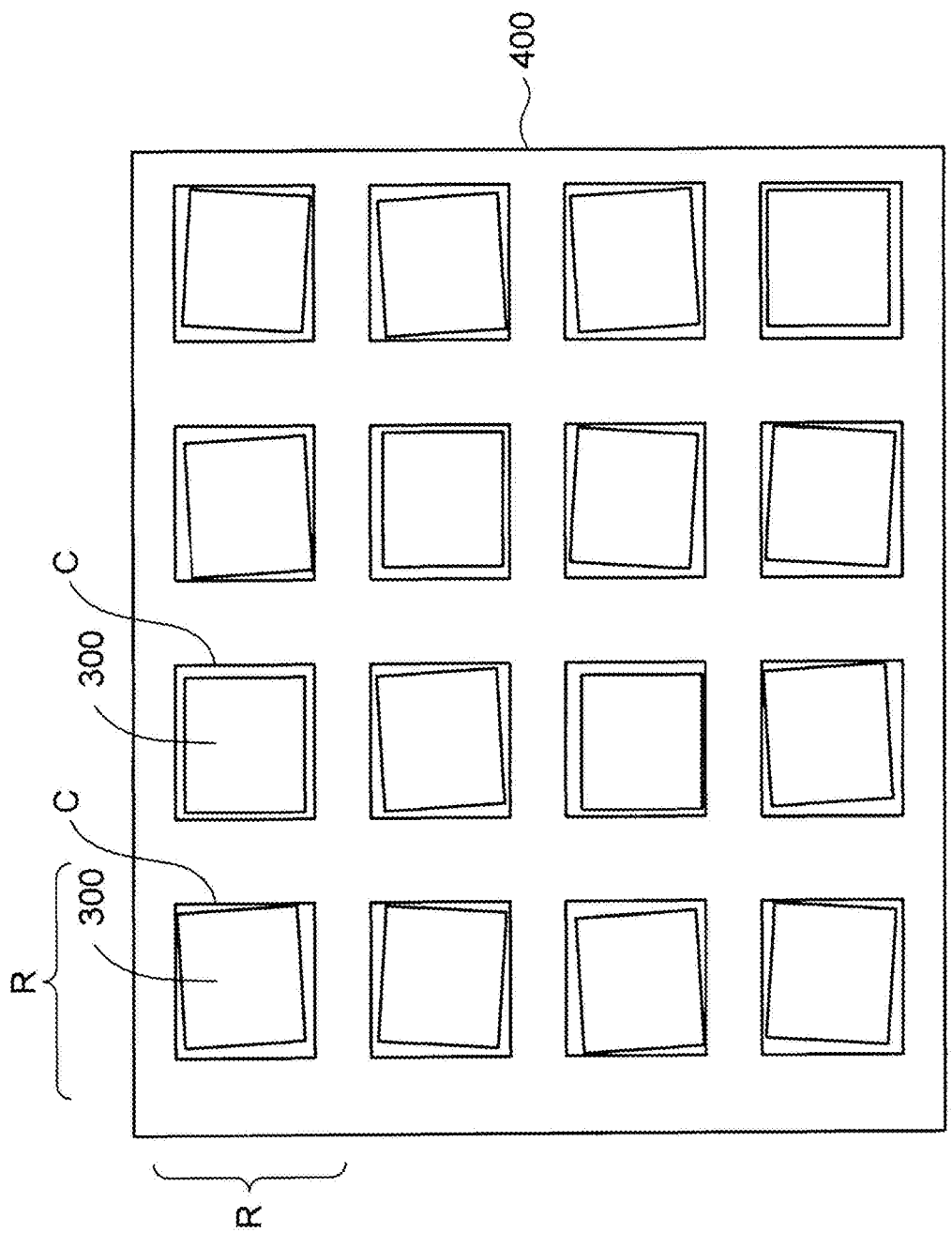
FIG. 3 is a plan view for illustrating the problem of the electronic component-embedded substrate relating to the preliminary matters (3 thereof)

Actually, as shown in a plan view of FIG. 3, a substrate 400 for multiple formation having a plurality of product regions R is used, and the first semiconductor chip 300 is mounted in the cavity C of each product region R, respectively.

At this time, the positional deviation directions of the first semiconductor chips 300 in the cavities C are different and the first semiconductor chips 300 are arranged with being misaligned each other between the plurality of product regions R of the substrate 400 for multiple formation.

The first semiconductor chip 300 arranged in the cavity C is embedded in an insulation layer (not shown) formed thereon. A first pad (not shown) connected to a connection terminal of the first semiconductor chip 300 through a via hole is formed on the insulation layer positioned immediately above the connection terminal.

Also, a second pad (not shown) that is to be connected to the multi-layered wiring layer through a via hole is formed on the insulation layer in a lateral region of the semiconductor chip 300.

When the semiconductor chip 300 is arranged with being positionally misaligned in the cavity C, a positional relation between the first pad immediately above the connection terminal of the semiconductor chip 300 and the second pad connected to the multi-layered wiring layer deviates from the design specification. For this reason, when connecting connection terminals of the second semiconductor chip to the first pad and the second pad, the mutual positions deviate, so that the connection reliability is lowered.

Also, when an interval between the first semiconductor chip 300 and an inner wall surface of the cavity C is too narrowed due to the positional deviation of the first semiconductor chip 300, a void is likely to be generated upon the formation of the insulation layer in which the first semiconductor chip 300 is to be embedded, so that the manufacturing yield is lowered.

According to an electronic component-embedded substrate and a method of manufacturing the same in accordance with an exemplary embodiment to be described below, the above problems can be solved.

Exemplary Embodiment

Figure 17:
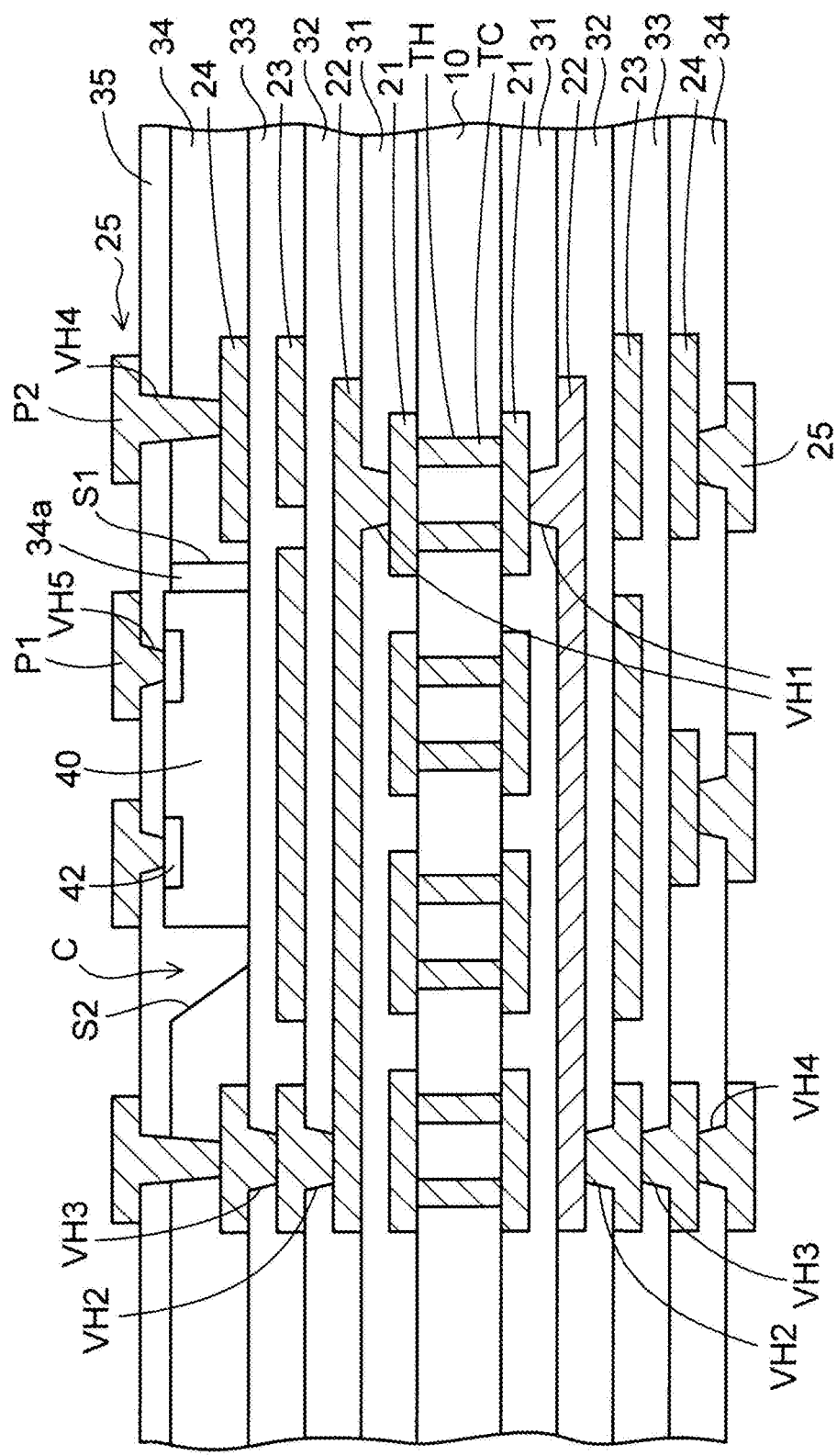
FIG. 17 is a sectional view depicting the manufacturing method of the electronic component-embedded substrate in accordance with the exemplary embodiment (13 thereof)
Figure 18:
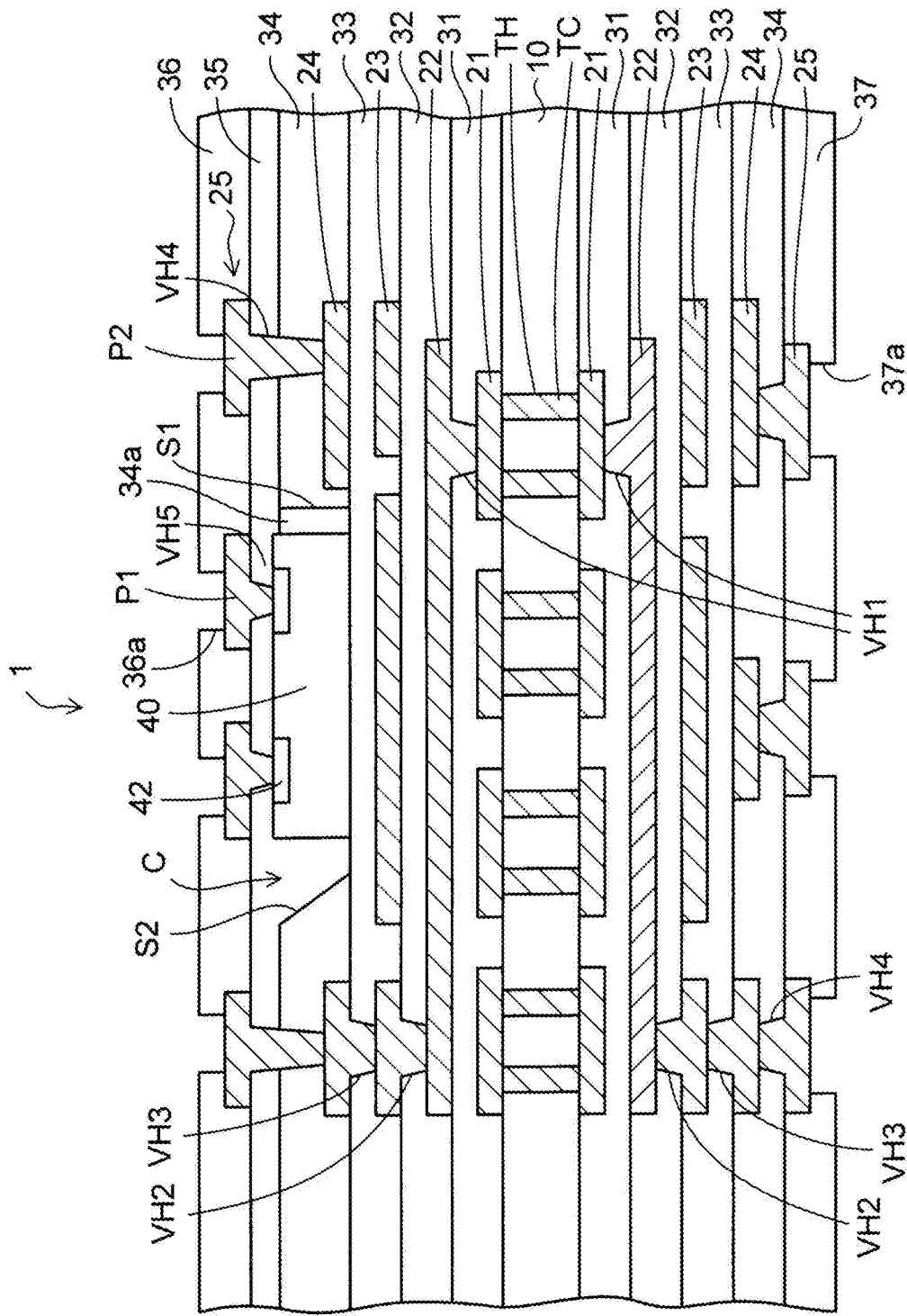
FIG. 18 is a sectional view depicting the manufacturing method of the electronic component-embedded substrate in accordance with the exemplary embodiment (14 thereof)
Figure 19:
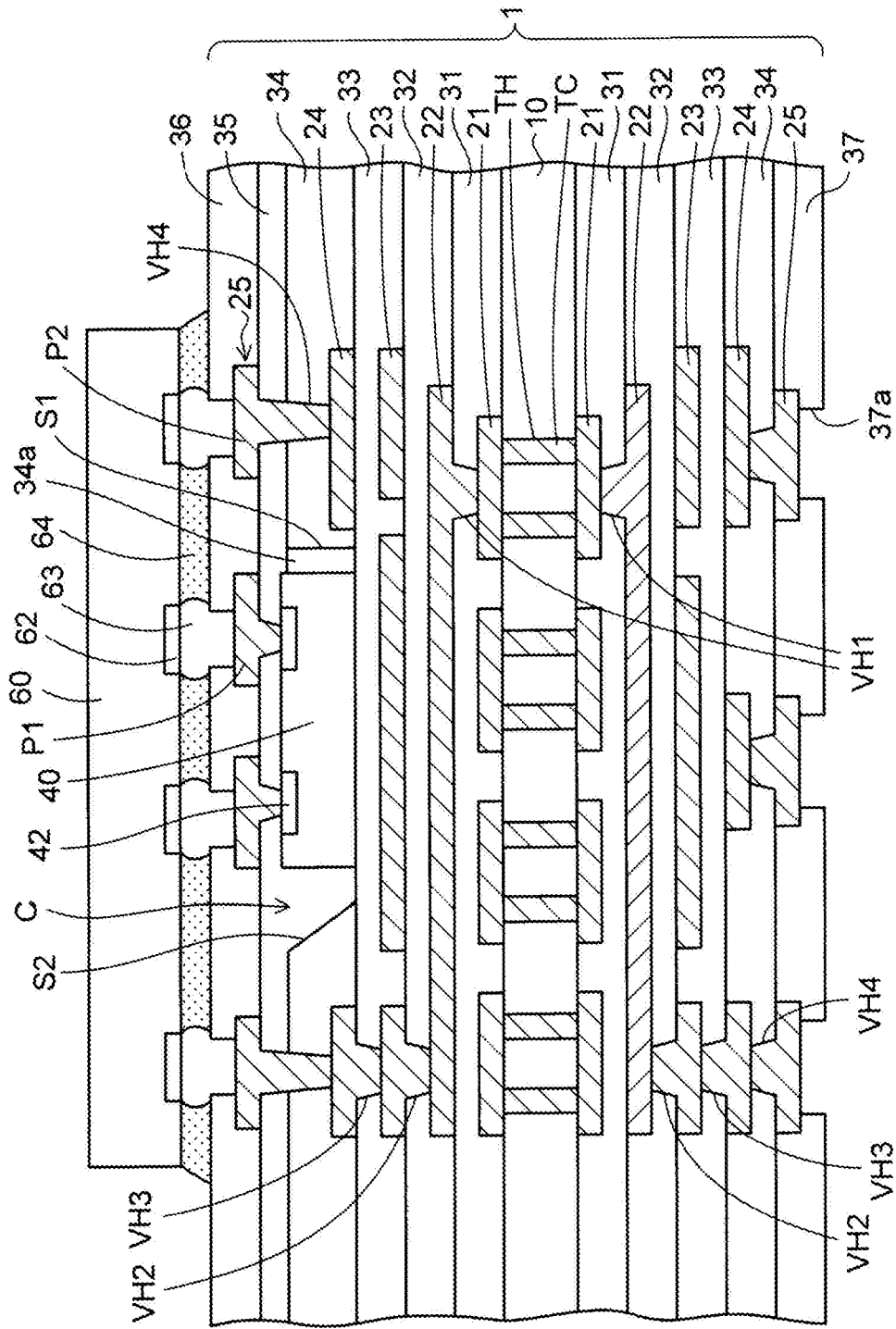
FIG. 19 is a sectional view depicting a manufacturing method of an electronic component device in accordance with the exemplary embodiment.
Figure 20:
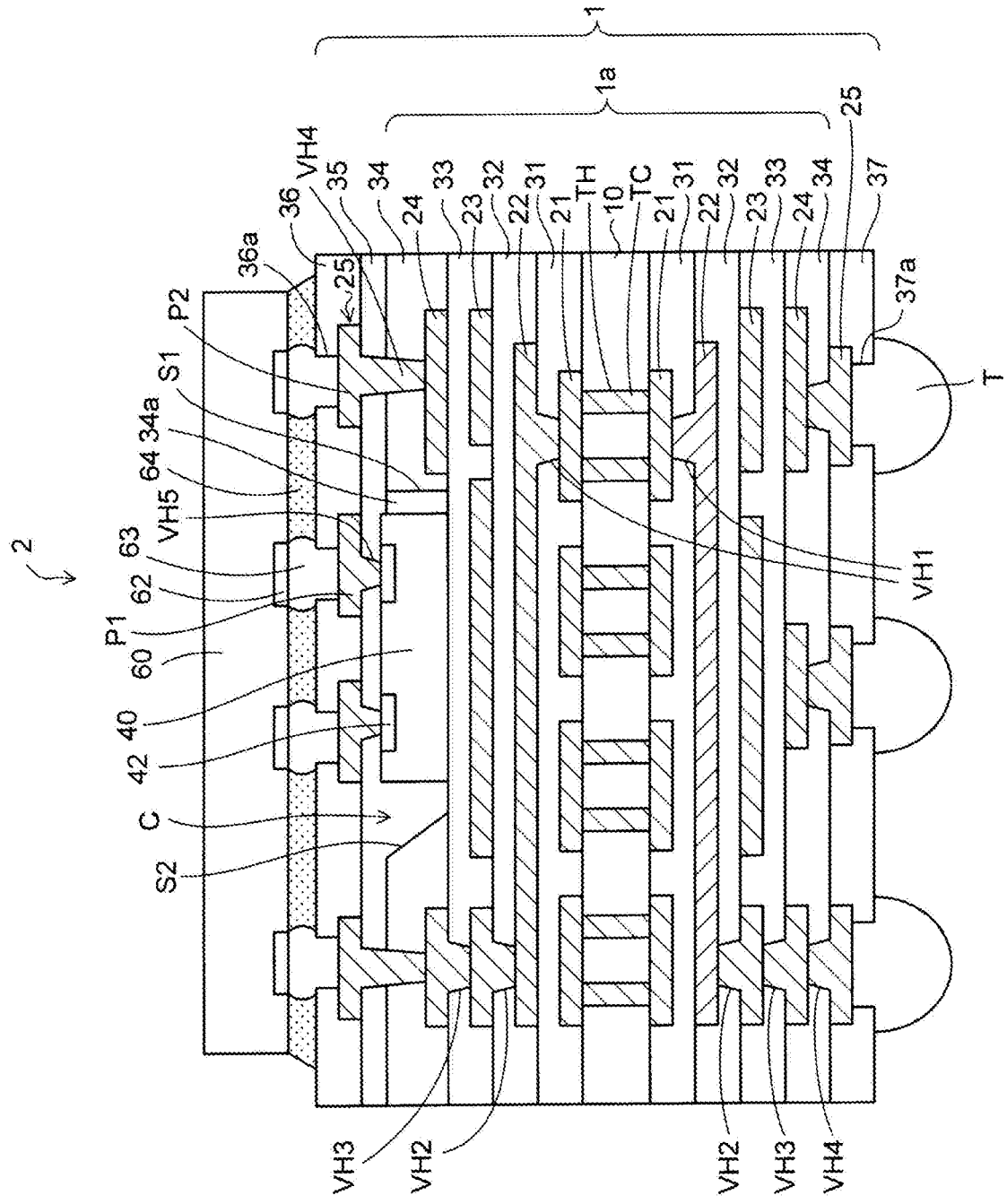
FIG. 20 is a sectional view depicting the electronic component device in accordance with the exemplary embodiment.

FIGS. 4 to 17 depict a manufacturing method of an electronic component-embedded substrate of the exemplary embodiment, FIG. 18 depicts an electronic component-embedded substrate of the exemplary embodiment, and FIGS. 19 and 20 depict an electronic component device of the exemplary embodiment.

In the below, structures of the electronic component-embedded substrate and the electronic component device are described while describing the manufacturing method of the electronic component-embedded substrate.

Figure 4:
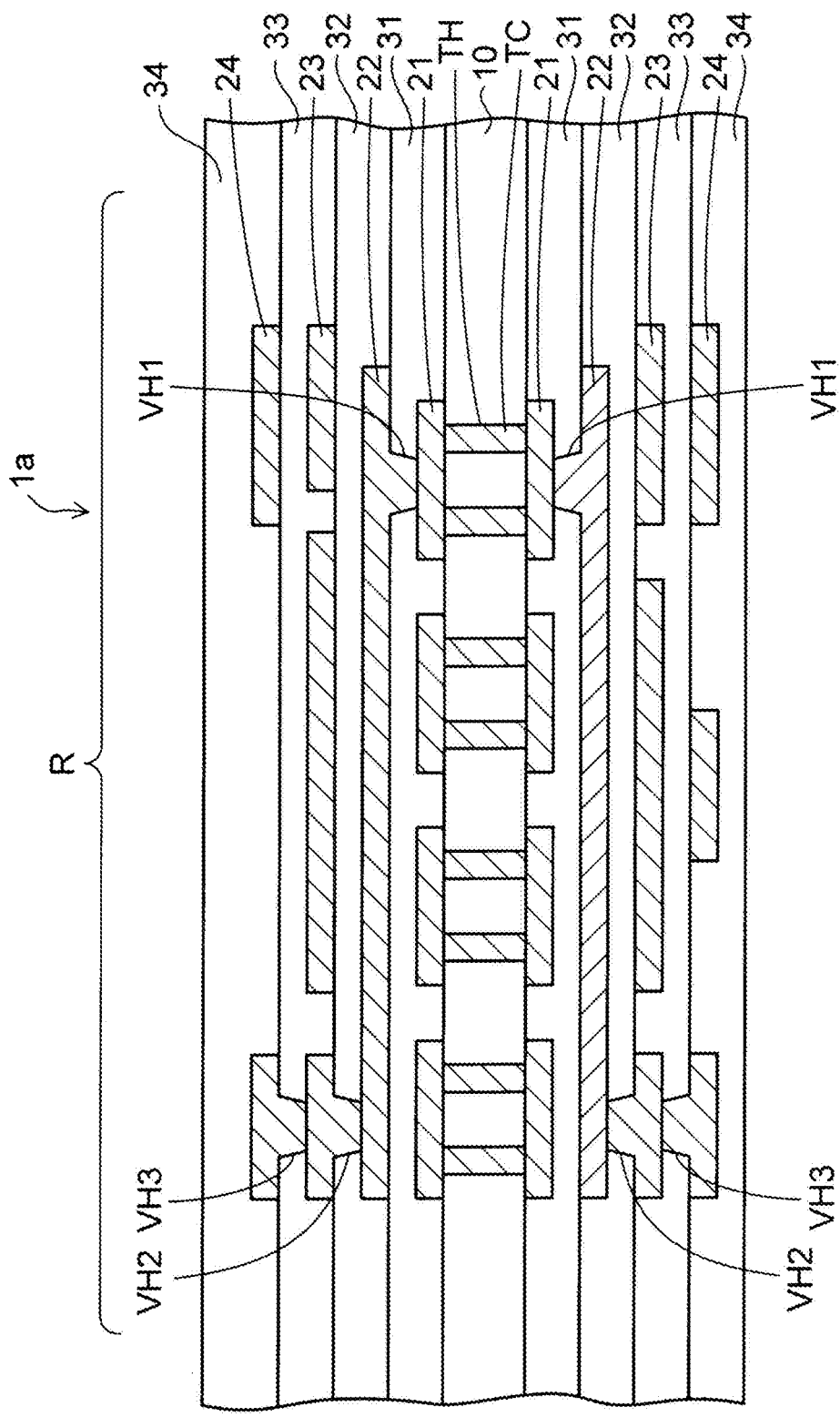
FIG. 4 is a sectional view depicting a manufacturing method of an electronic component-embedded substrate in accordance with an exemplary embodiment (1 thereof)

In the manufacturing method of the electronic component-embedded substrate of the exemplary embodiment, a wiring member 1a as shown in FIG. 4 is first prepared. The wiring member 1a is a large-scaled substrate for multiple formation. In FIG. 4, one product region R is partially shown.

The wiring member 1a has a core substrate 10 at a center in a thickness direction. The core substrate 10 is formed of an insulating material such as a glass epoxy resin.

Both surfaces of the core substrate 10 are formed with wiring layers 21, respectively. The core substrate 10 is formed with through-holes TH penetrating in a thickness direction, and through-conductors TC are filled in the through-holes TH.

The wiring layers 21 on both the surfaces of the core substrate 10 are connected to each other via the through-conductors TC. The through-hole TH is formed by a drill, laser or the like, and the wiring layer 21 and the through-conductor TC are formed using photolithography, a plating technology and the like. The wiring layer 21 and the through-conductor TC are formed of copper, for example.

Also, insulation layers 31 covering the wiring layers 21 are formed at both the surfaces of the core substrate 10, respectively. The insulation layer 31 is formed by bonding an uncured resin film such as an epoxy resin, a polyimide resin or the like and curing the resin sheet by heating.

Also, the insulation layers 31 at both the surfaces are formed with via holes VH1 reaching the wiring layers 21, respectively. The via hole VH1 is formed by subjecting the insulation layer 31 to laser processing.

Alternatively, the via hole VH1 may be formed by forming the insulation layer 31 with a photosensitive resin and performing exposure and developing on the basis of the photolithography. The insulation layer 31 may be formed by applying a liquid resin. The other insulation layers to be described later are also formed by the same method.

Also, the insulation layers 31 at both the surfaces are formed thereon with wiring layers 22, respectively. The wiring layers 22 at both the surfaces are respectively connected to the wiring layers 21 through via-conductors in the via holes VH1.

The wiring layer 22 may be formed by a variety of wiring forming methods such as a semi-additive method. When using the semi-additive method, a seed layer is first formed on an inner surface of the via hole VH1 and on the insulation layer 31. Also, a plated resist layer having an opening and corresponding to the wiring layer 22 is formed on the seed layer.

Subsequently, a metal plated layer is formed from an inside of the via hole VH1 to the opening of the plated resist layer by an electrolytic plating method in which the seed layer is used as a plating power feeding path. Also, after removing the plated resist layer, the seed layer is etched using the metal plated layer as a mask.

Thereby, the wiring layer 22 is formed by the seed layer and the metal plated layer. The other wiring layers to be described later are also formed by the same method.

Also, insulation layers 32 covering the wiring layers 22 are respectively formed on the insulation layers 31 at both the surfaces. The insulation layers 32 at both the surfaces are formed with via holes VH2 reaching the wiring layers 22.

Wiring layers 23 are respectively formed on the insulation layers 32 at both the surfaces. The wiring layers 23 are connected to the wiring layers 22 through via-conductors in the via holes VH2.

Also, similarly, insulation layers 33 covering the wiring layers 23 are respectively formed on the insulation layers 32 at both the surfaces. The insulation layer 33 at both the surfaces are formed with via holes VH3 reaching the wiring layers 23, respectively. Wiring layers 24 are respectively formed on the insulation layers 33 at both the surfaces. The wiring layers 24 are connected to the wiring layers 23 through via-conductors in the via holes VH3.

Also, insulation layers 34 covering the wiring layers 24 are respectively formed on the insulation layers 33 at both the surfaces. The insulation layer 34 provided at the upper surface is an example of the first insulation layer. In this way, the wiring member having the first insulation layer is prepared.

In the example of the wiring member 1a of FIG. 4, the four wiring layers 21, 22, 23, 24 are stacked at each of both the surfaces of the core substrate 10. However, the number of the wiring layers to be stacked can be arbitrarily set.

Also, in FIG. 4, the rigid wiring member having the core substrate is exemplified. However, a variety of flexible wiring members with no core substrate can be used.

The wiring member 1a has the wiring layer 24 (an example of the wiring layer) covered with the insulation layer 34 (an example of the first insulation layer) in a lateral region of a part in which the cavity is to be arranged.

Figure 5:
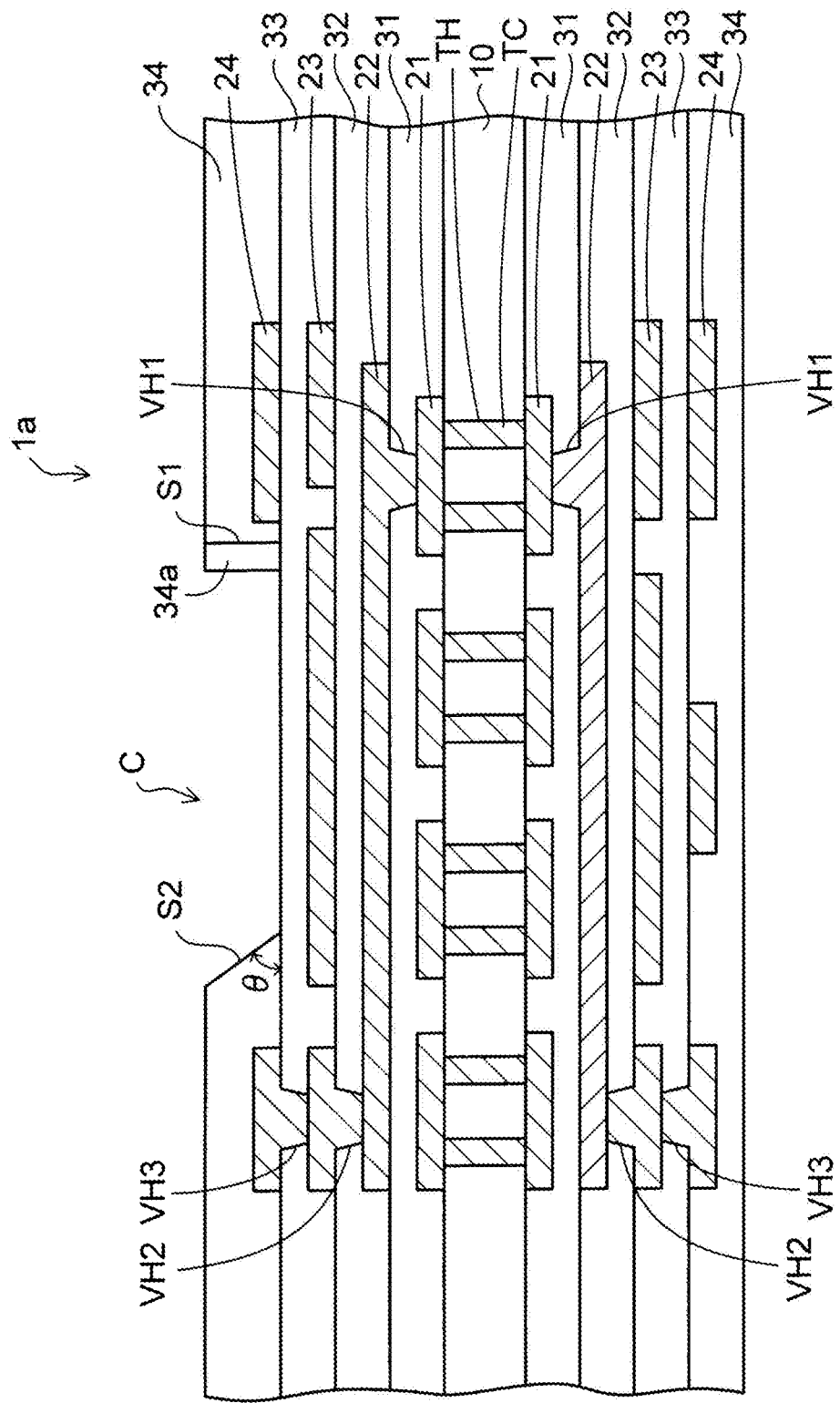
FIG. 5 is a sectional view depicting the manufacturing method of the electronic component-embedded substrate in accordance with the exemplary embodiment (2 thereof)

Subsequently, as shown in FIG. 5, the insulation layer 34 provided at the upper surface of the wiring member 1a is subjected to laser processing, so that a cavity C (opening) is formed. The insulation layer 34 is penetrated in the thickness direction and an upper surface of the insulation layer 33 under the insulation layer 34 is exposed, so that the cavity C is formed.

The cavity C may also be formed by penetrating the insulation layer 34 and processing the insulation layer 33 under the insulation layer 34 to a part of a thickness thereof. Alternatively, the cavity C may also be formed by processing the insulation layer 34 from an upper surface to a part of a thickness thereof. The insulation layer is left between a bottom surface of the cavity C and an upper surface of the wiring layer 23.

Figure 6:
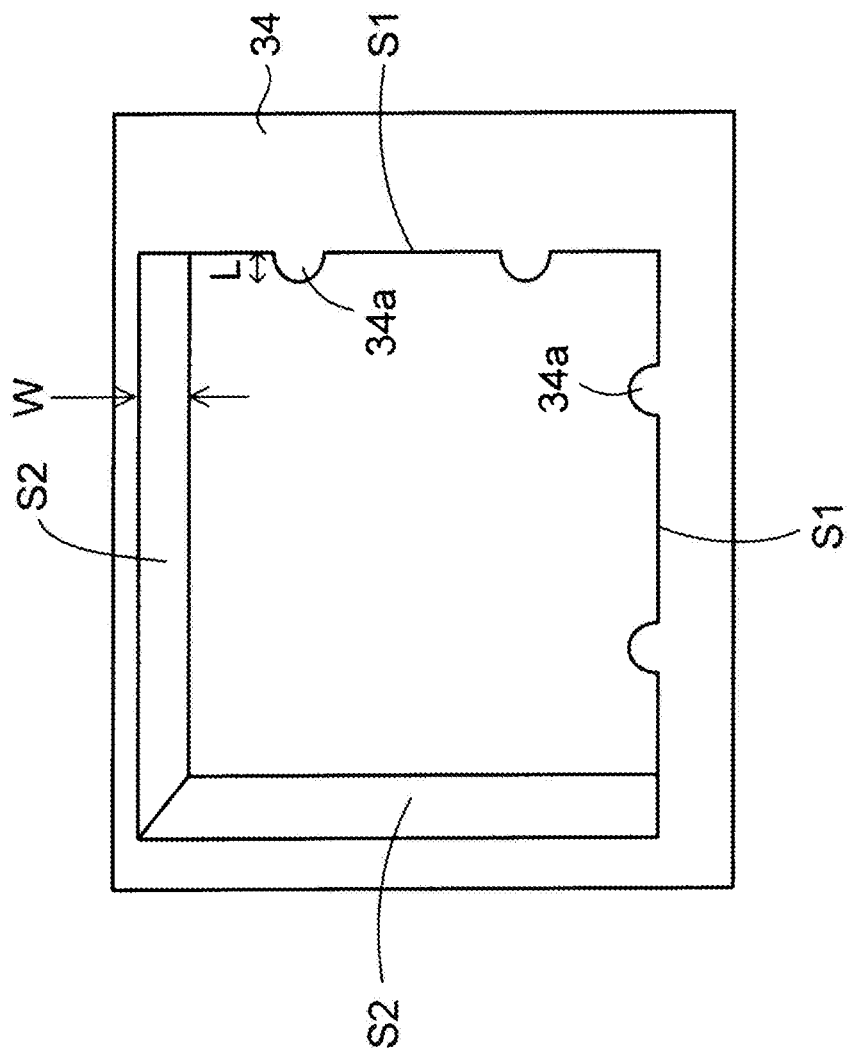
FIG. 6 is a plan view depicting the manufacturing method of the electronic component-embedded substrate in accordance with the exemplary embodiment (3 thereof)

FIG. 6 is a partial plan view of the cavity C of FIG. 5, as seen from above. As shown in FIG. 6, the cavity C has a quadrangular shape, as seen from above. Referring to FIGS. 5 and 6, the cavity C has two adjacent inner wall surfaces S1 and protrusions 34a protruding inward from the inner wall surfaces S1.

The protrusion 34a has a semicircular column shape. As seen from above, a diameter portion of the semicircular column connect to the inner wall surface S1 of the cavity C, and a circular arc portion protrudes from the inner wall surface S of the cavity C. Referring to FIG. 5, the protrusion 34a has the same height as the inner wall surface S1 of the cavity C.

A thickness (height of the cavity C) of the insulation layer 34 is about 100 μm, for example. Also, a protruding length L (FIG. 6) of the protrusion 34a is about 60 μm, for example.

The protrusion 34a of the cavity C functions as a guide pin for contacting and positioning the semiconductor chip. In order to accurately position the semiconductor chip, the protrusions 34a are separately formed at two portions of each of the two inner wall surfaces S1.

Also, referring to FIGS. 5 and 6, the cavity C has two adjacent inclined inner wall surfaces S2 at opposite sides to the two inner wall surfaces S1 having the protrusions 34a formed thereon. The inclined inner wall surface S2 has a tapered shape where it is inclined downward from an outer side toward an inner side. An inclination angle θ (FIG. 5) of the inclined inner wall surface S2 of the cavity C is set within a range of 30° to 60° for example, 45°.

For example, when the thickness of the insulation layer 34 is 100 μm and the inclination angle θ of the inclined inner wall surface S2 of the cavity C is set to 45°, a width (FIG. 6) of the inclined inner wall surface S2, as seen from above, is 100 μm.

The inclined inner wall surface S2 of the cavity C is formed so as to easily mount the semiconductor chip into the cavity C.

Figure 7:
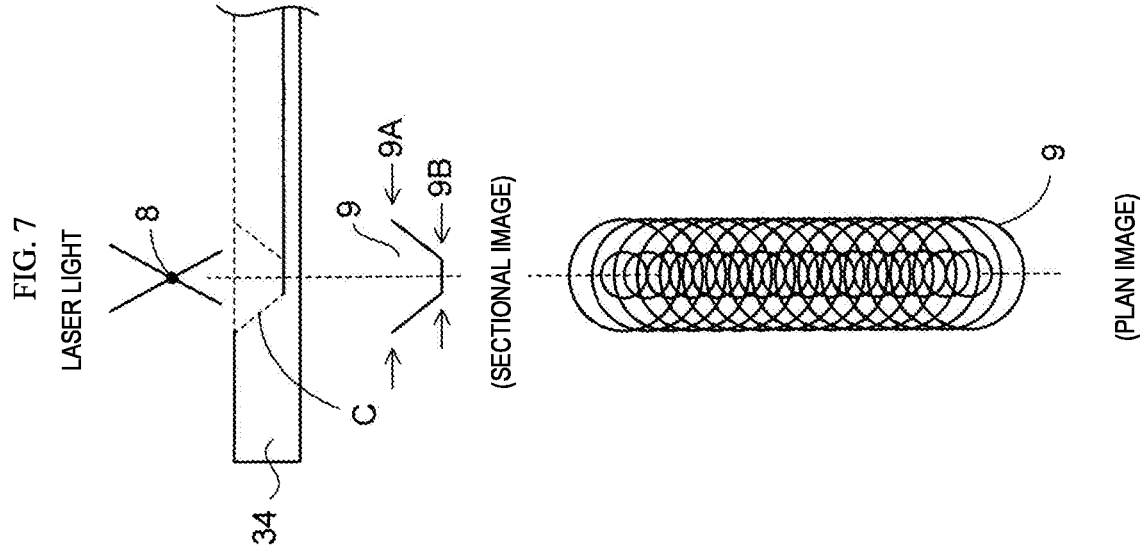
FIG. 7 is a sectional image and a plan image for illustrating a method of forming a cavity of FIGS. 5 and 6 by laser processing.

FIG. 7 depicts a method of forming the inclined inner wall surface S2 of the cavity C. As shown in FIG. 7, since the laser light is not parallel light but converging light, the laser light converges toward the front of the beam.

In the exemplary embodiment, the laser light is irradiated in a defocused state so that a focus (focusing point) 8 of the laser light is to deviate in an optical axis direction with respect to a surface of the insulation layer 34. As the laser, carbon dioxide laser ($CO_2$ laser) is used, for example.

Referring to a sectional image of FIG. 7, when the laser light is irradiated in the defocused state, a diameter 9A of an upper end of a processed hole 9, which is formed by one shot of laser, becomes larger than that upon the in-focus, and a diameter 9B of a lower end of the processed hole 9 is substantially the same as that upon the in-focus. The in-focus is a state where the focus 8 of the laser light is matched to the surface of the insulation layer 34.

By using the above characteristic, the diameter 9A of the upper end of the processed hole 9, which is formed by one shot of laser, is larger than the diameter 9B of the lower end. Therefore, an inner wall surface of the processed hole 9 has a tapered shape where it is inclined downward from an outer side toward an inner side. For example, the diameter 9A of the upper end of the processed hole 9 is about twice as large as the diameter 9B of the lower end.

As shown in a plan image of FIG. 7, the laser light is irradiated in the defocused state, and the laser processing is sequentially performed for the insulation layer 34 corresponding to two linear regions becoming the inclined inner wall surfaces S2 of the cavity C.

The laser is irradiated to the insulation layer 34 with the shot of the laser being sequentially displaced in a horizontal direction so that the processed holes 9 are to be partially overlapped. Thereby, the plurality of processed holes 9 communicates with each other, so that the inclined inner wall surfaces S2 of the cavity C are obtained.

The laser processing for forming the cavity C of a region except the inclined inner wall surfaces S2 is performed in a state where the focus 8 of the laser light is made to be the in-focus on the surface of the insulation layer 34. For this reason, the inner wall surface S1 of the cavity C except the inclined inner wall surfaces S2 is formed as a vertical surface or an inclined surface of which a taper close to a vertical surface is gentle.

The cavity C is formed by the laser processing, so that it is possible to easily form, on the inner wall surface S1 of the cavity C, the protrusions 34a of a semicircular column shape having the same height as the inner wall surface S1.

Alternatively, the cavity C having the above structure may be formed by combining mechanical processing such as router and the laser processing.

Figure 8:
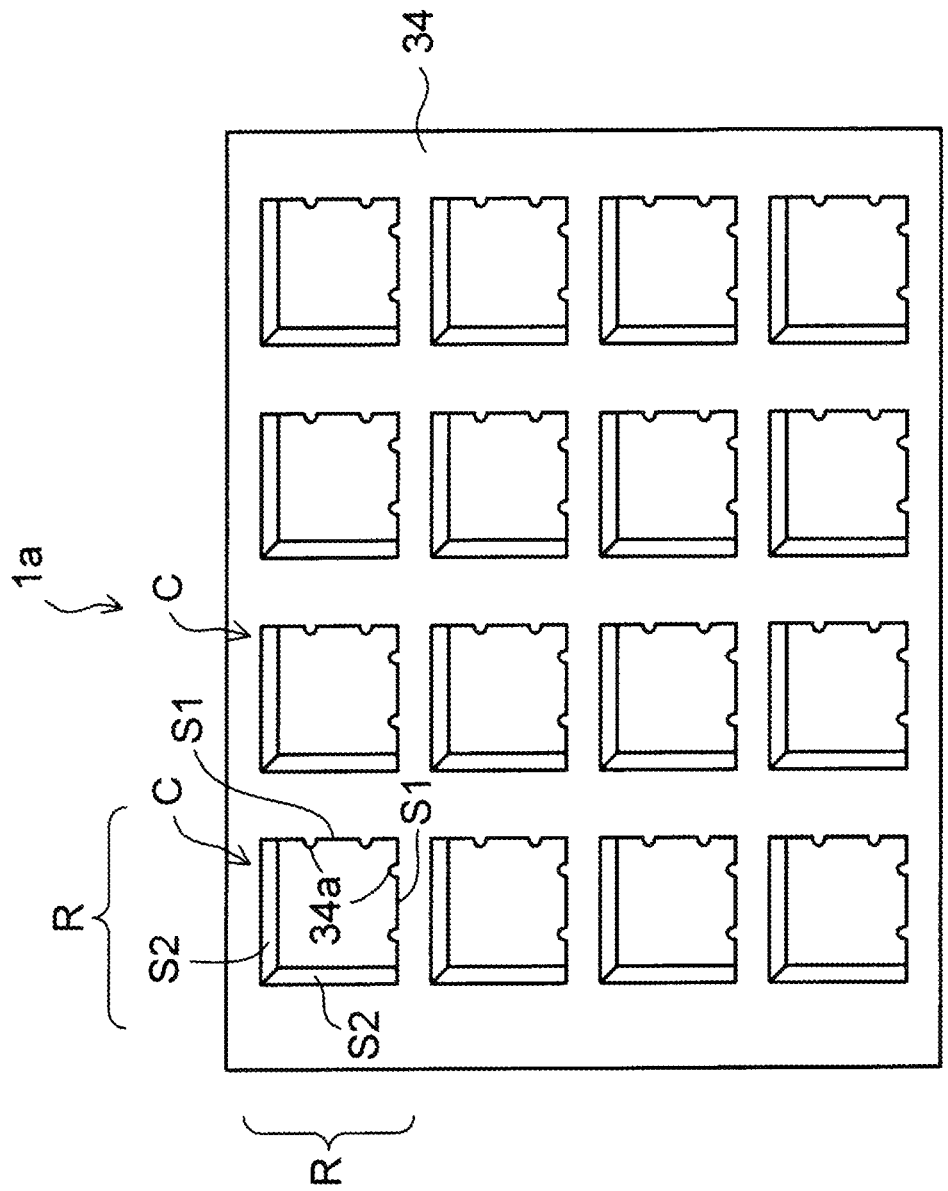
FIG. 8 is a plan view depicting the manufacturing method of the electronic component-embedded substrate in accordance with the exemplary embodiment (4 thereof)

FIG. 8 depicts the entire shape of the wiring member 1a. As shown in FIG. 8, the wiring member 1a is divided into a plurality of product regions R, and each product region R is formed with the cavity C having the inner wall surfaces S1, on which the protrusions 34a are formed, and the inclined inner wall surfaces S2.

Figure 9:
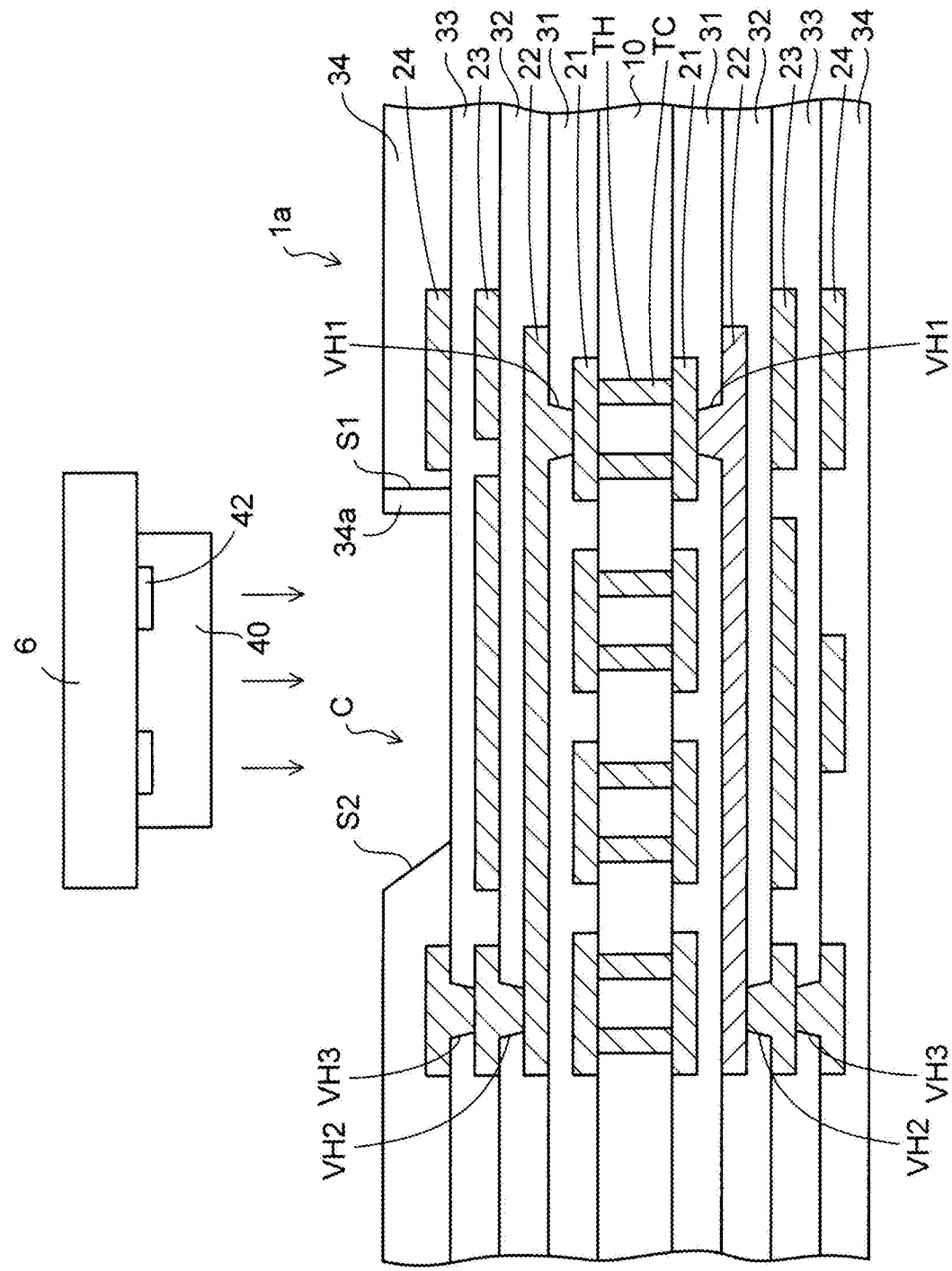
FIG. 9 is a sectional view depicting the manufacturing method of the electronic component-embedded substrate in accordance with the exemplary embodiment (5 thereof)

Then, as shown in FIG. 9, a first semiconductor chip 40 having connection terminals 42 provided on a surface and a mounter apparatus 6 are prepared, and the surface of the first semiconductor chip 40 is sucked to the mounter apparatus 6.

A backside of the first semiconductor chip 40 is applied with an uncured adhesive (not shown).

The first semiconductor chip 40 is an example of the first electronic component, and a variety of electronic components such as a capacitor element, a resistance element, an inductor element and the like can be used.

An alignment mark (not shown) is formed at the periphery of each product region R of the wiring member 1a shown in FIG. 8, and the mounter apparatus 6 includes an image recognition means for recognizing the alignment mark.

As shown in FIG. 9, when the mounter apparatus 6 having sucked the first semiconductor chip 40 recognizes an image of the alignment mark of the wiring member 1a, the first semiconductor chip 40 is positionally aligned in the cavity C of the wiring member 1a.

Figure 10:
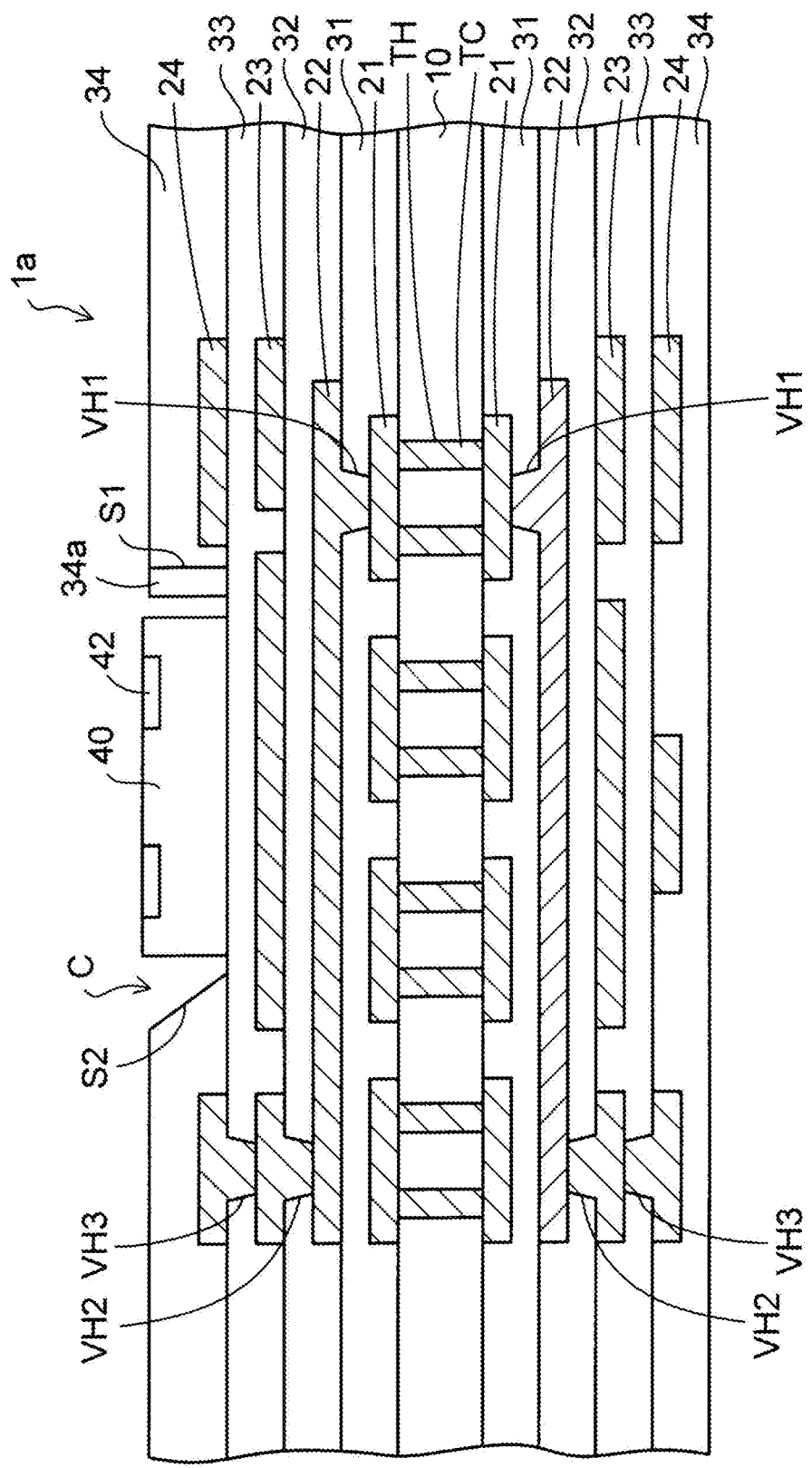
FIG. 10 is a sectional view depicting the manufacturing method of the electronic component-embedded substrate in accordance with the exemplary embodiment (6 thereof)

Then, as shown in FIG. 10, the backside of the first semiconductor chip 40 sucked to the mounter apparatus 6 is arranged on the bottom surface of the cavity C of the wiring member 1a, and the mounter apparatus 6 is then removed from the first semiconductor chip 40.

In the example of FIG. 10, an entire thickness of the first semiconductor chip 40 is greater than a depth of the cavity C, so that the surface of the first semiconductor chip 40 is arranged at a position slightly higher than the surface of the insulation layer 34.

The mounter apparatus 6 has the positioning function based on the image recognition. However, predetermined positional deviation (for example, +15 μm) occurs, depending on the apparatus specification.

In the exemplary embodiment, the cavity C has the two inclined inner wall surfaces S2 at one side, so that an opening size of the cavity C increases and the first semiconductor chip 40 can be thus easily mounted.

Figure 11A:
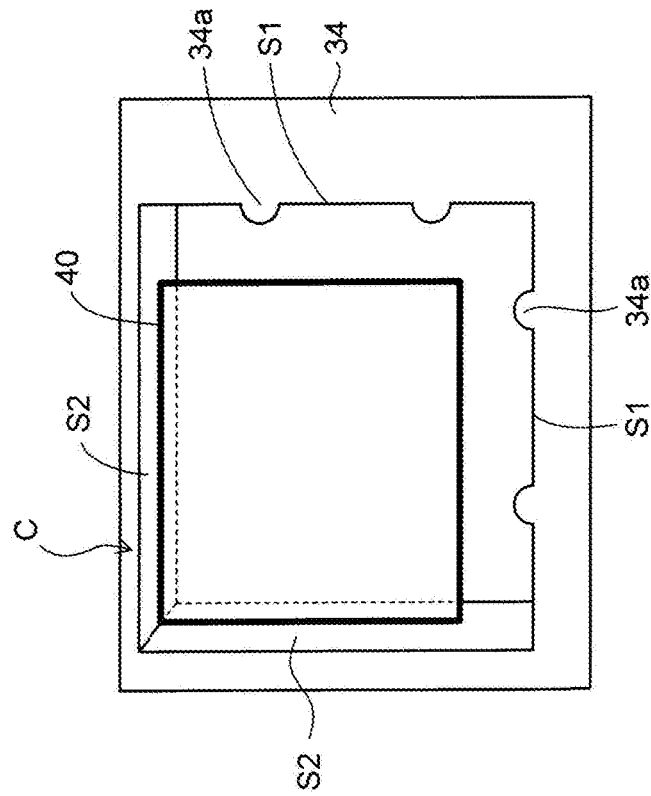
FIGS. 11A and 11B are plan views depicting the manufacturing method of the electronic component-embedded substrate in accordance with the exemplary embodiment (7 thereof)
Figure 11B:
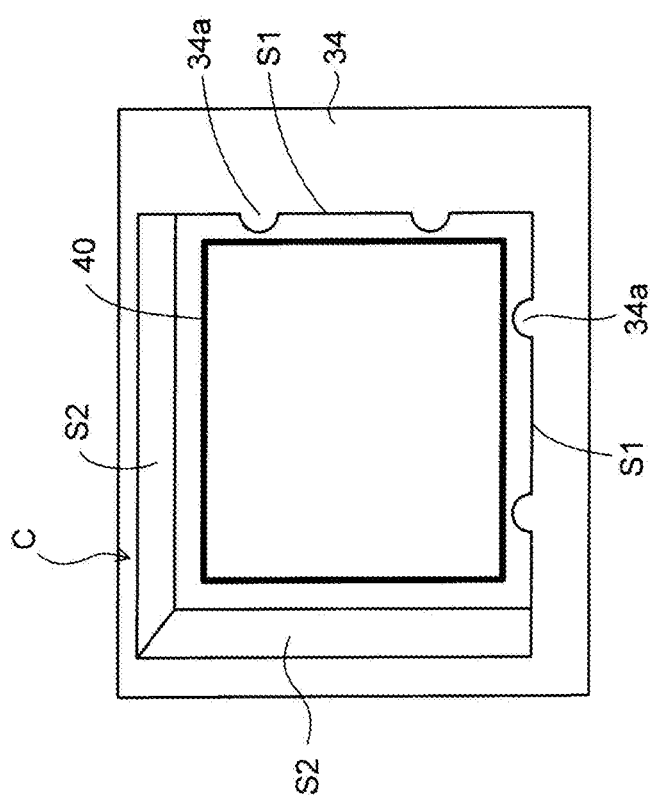

As shown in FIG. 11A, when mounting the first semiconductor chip 40 into the cavity C with the mounter apparatus 6, the first semiconductor chip 40 is positionally aligned to be arranged at a central part of the cavity C. FIG. 11B depicts an example where two sides of the first semiconductor chip 40 are arranged on the inclined inner wall surfaces S2 of the cavity C due to the positional deviation.

When mounting the first semiconductor chip 40 into the cavity C, the first semiconductor chip 40 is arranged with an interval from the protrusions 34a of the cavity C so as not to contact the protrusions 34a.

Also, as described later, after the first semiconductor chip 40 is mounted in the cavity C, the first semiconductor chip 40 is moved and contacted to the protrusions 34a formed on the two inner wall surfaces S1 of the cavity C at the other side.

Thereby, the first semiconductor chip 40 is arranged with being positionally determined at a reference position in the cavity C. In this way, the protrusions 34a formed on the two inner wall surfaces S1 of the cavity C function as guide pins for positioning the first semiconductor chip 40.

Figure 12:
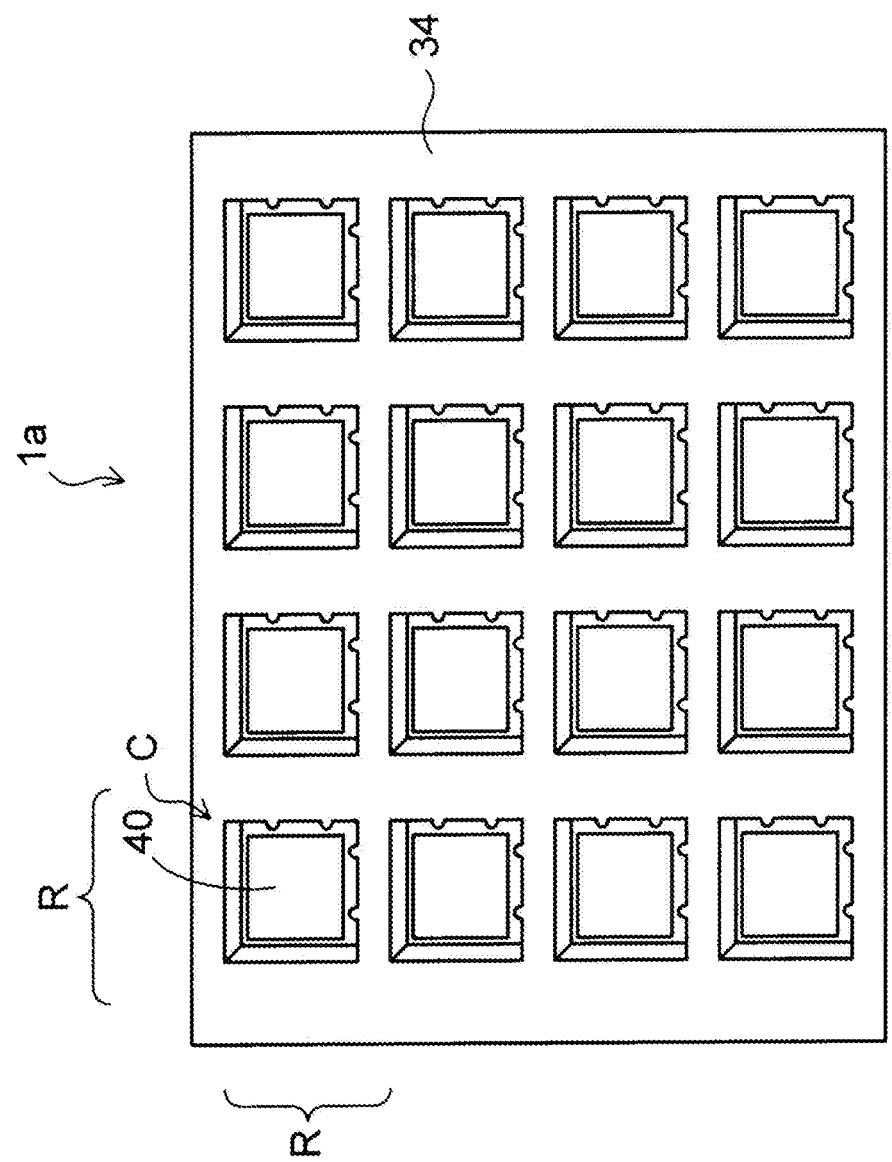
FIG. 12 is a plan view depicting the manufacturing method of the electronic component-embedded substrate in accordance with the exemplary embodiment (8 thereof)

FIG. 12 depicts an entire shape of the wiring member 1a. As shown in FIG. 12, the first semiconductor chip 40 is arranged with being positionally aligned in the cavity C of each product region R of the wiring member 1a by the mounter apparatus 6.

Actually, the first semiconductor chips 40 that are arranged in the cavities C of the respective product regions R of the wiring member 1a are arranged with being positionally misaligned in different directions (X, Y and θ directions).

Figure 13:
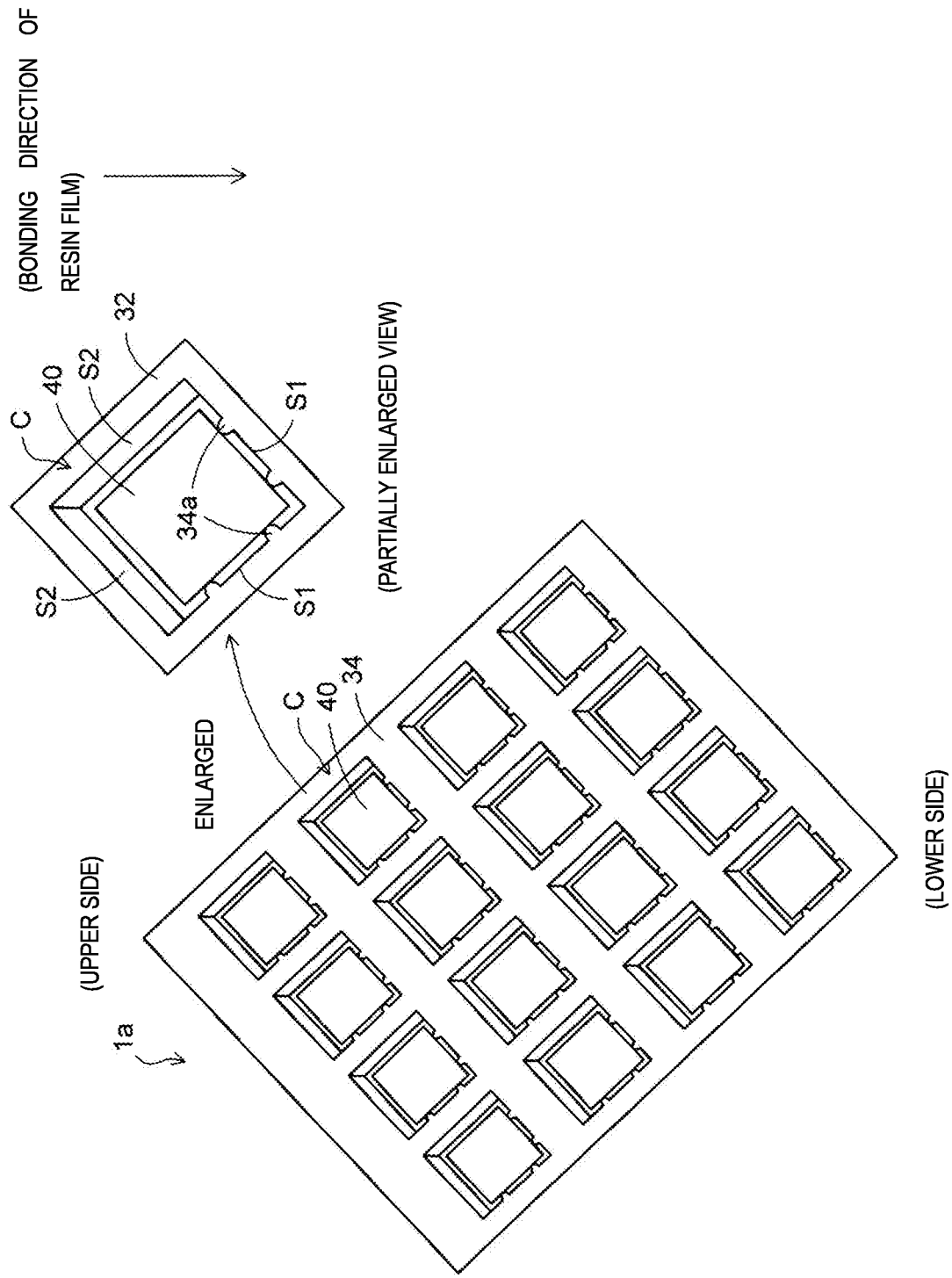
FIG. 13 is a plan view depicting the manufacturing method of the electronic component-embedded substrate in accordance with the exemplary embodiment (9 thereof)

Subsequently, a method of bringing the first semiconductor chip 40 mounted in the cavity C into contact with the protrusions 34a formed on the two inner wall surfaces S1 is described. As shown in FIG. 13, the wiring member 1a of FIG. 12 is rotated so that the two inner wall surfaces S1 having the protrusions 34a of the cavity C are to be arranged in a V shape.

Also, the wiring member 1a is tilted so that the two inner wall surfaces S1 having the protrusions 34a of the cavity C are to be located at the lower side and the two inclined inner wall surfaces S2 are to be located at the upper side.

Figure 14:
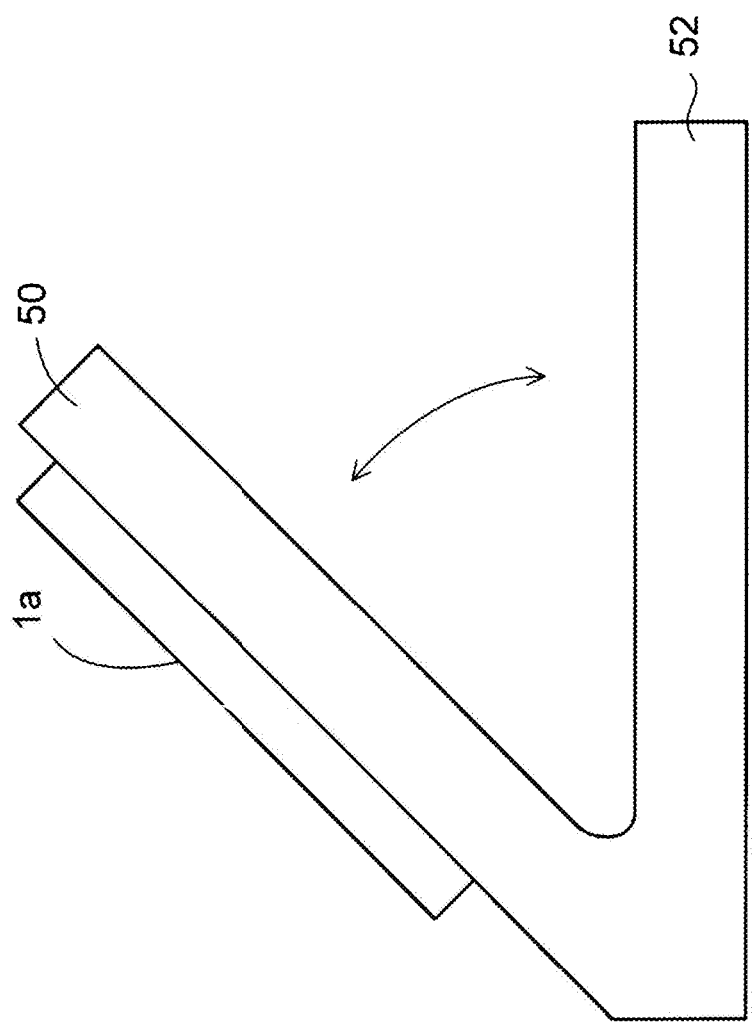
FIG. 14 is a side view depicting the manufacturing method of the electronic component-embedded substrate in accordance with the exemplary embodiment (10 thereof)

As shown in FIG. 14, the wiring member 1a of FIG. 13 is fixed on an inclination stage 50 coupled to a support member 52, and the inclination stage 50 is tilted, so that the wiring member 1a is tiled, as shown in FIG. 13, Thereby, referring to a partially enlarged view of FIG. 13, the two adjacent sides of the first semiconductor chip 40 are moved and contacted to the protrusions 34a formed on the two inner wall surfaces S1 of the cavity C of the wiring member 1a by the gravity.

Thereby, as shown in FIG. 13, the plurality of first semiconductor chips 40 is arranged with being positionally determined at the same position in the respective cavities C of the wiring member 1a. Thereafter, the uncured adhesive applied to the backsides of the first semiconductor chips 40 is heated and is completely cured.

Since the first semiconductor chip 40 is moved and contacted to the protrusions 34a with the adhesive being interposed between the backside of the first semiconductor chip 40 and the bottom surface of the cavity C, a thermosetting adhesive of a low viscosity type is used as the adhesive.

Alternatively, the adhesive may be applied to the bottom surface of the cavity C, instead of applying the adhesive to the backside of the first semiconductor chip 40.

When mounting the first semiconductor chip 40 into the cavity C of the wiring member 1a with the mounter apparatus 6, as described above, the predetermined positional deviation occurs. However, in the exemplary embodiment, the wiring member 1a is tilted to bring the first semiconductor chip 40 into contact with the protrusions 34a of the inner wall surfaces S1 of the cavity C and is thus positionally determined.

In this way, the positional deviation that is to occur when mounting the first semiconductor chip 40 into the cavity C with the mounter apparatus 6 is cancelled. Therefore, a positional deviation amount of the first semiconductor chip 40 from the design specification depends on only the processing precision when subjecting the insulation layer 34 to the laser processing to form the protrusions 34a of the cavity C.

For this reason, the positional deviation amount of the connection terminals 42 of the first semiconductor chip 40 in the cavity C is reduced, so that it is possible to further suppress the positional deviation from the design specification.

Also, since the connection terminals 42 of the first semiconductor chips 40 are arranged at substantially the same positions between the plurality of cavities C of the wiring member 1a, it is possible to improve the manufacturing yield when using a large-scaled substrate for multiple formation.

Also, the cavity C of the wiring member 1a has the two inclined inner wall surfaces S2 at the opposite sides to the two inner wall surfaces S1 having the protrusions 34a formed thereon. For this reason, since the opening size of the cavity C increases, it is possible to easily mount the first semiconductor chip 40.

Also, when the inclination angle θ of the inclined inner wall surface S2 of the cavity C is small, an outer periphery of the first semiconductor chip 40 may be arranged with remaining on the inclined inner wall surfaces S2 of the cavity C. Also in this case, when the wiring member 1a is tilted, it is possible to slide the first semiconductor chip 40 from the inclined inner wall surfaces S2 toward the protrusions 34a for positioning.

Like this, even when the outer periphery of the first semiconductor chip 40 is arranged on the inclined inner wall surfaces S2 of the cavity C, the outer periphery of the first semiconductor chip 40 is moved from the inclined inner wall surfaces S2 of the cavity C to the bottom surface and is then horizontally arranged.

Figure 15:
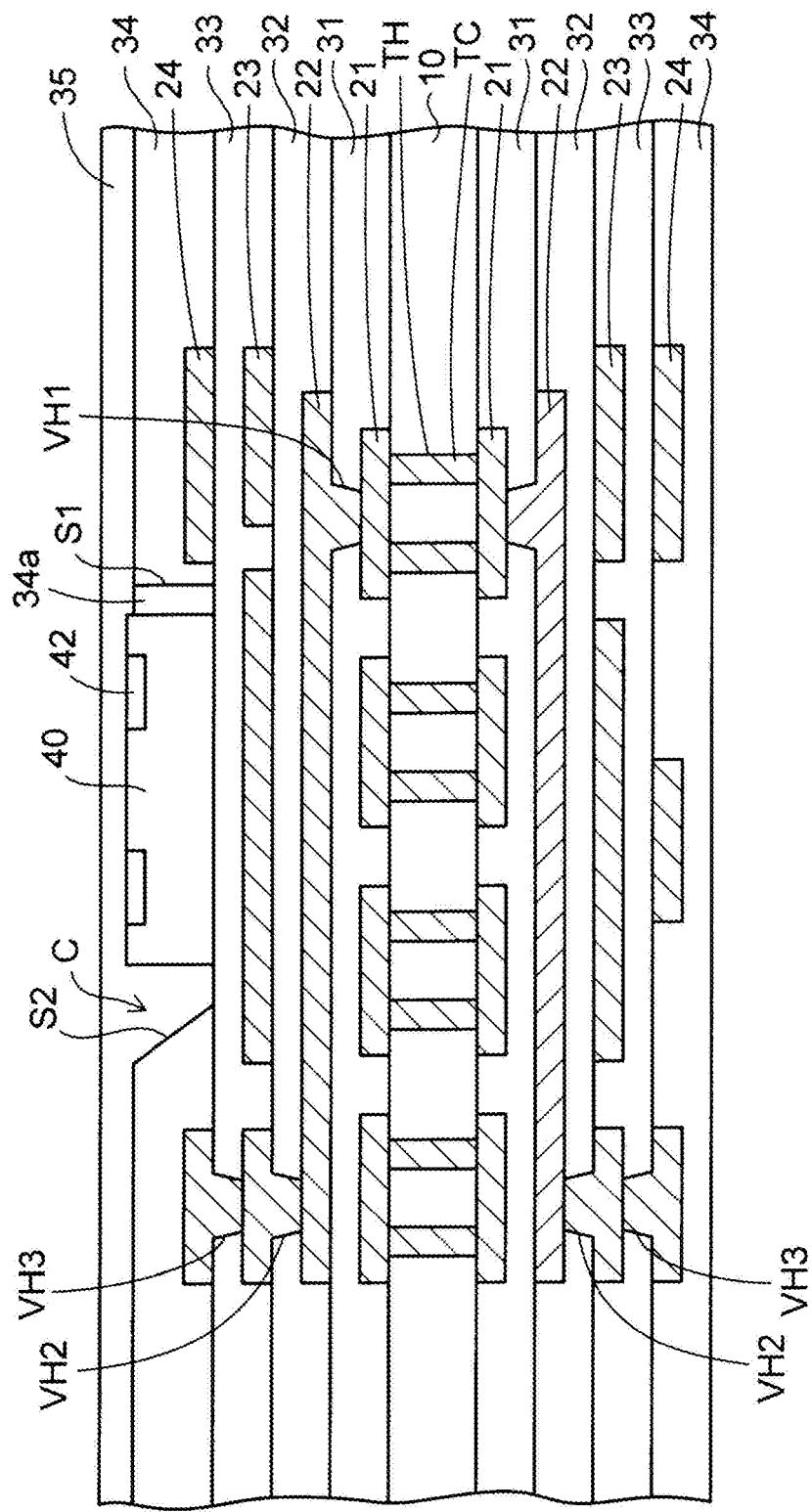
FIG. 15 is a sectional view depicting the manufacturing method of the electronic component-embedded substrate in accordance with the exemplary embodiment (11 thereof)

Then, as shown in FIG. 15, an insulation layer 35 is formed on the first semiconductor chip 40 and the insulation layer 34. The insulation layer 35 is an example of the second insulation layer. The insulation layer 35 is formed by stacking an uncured resin film on the first semiconductor chip 40 and the insulation layer 34 while pressurizing and heating the uncured resin film with a vacuum laminating machine.

Thereby, the insulation layer 35 is filled between the first semiconductor chip 40 and the inner wall surfaces S1 and inclined inner wall surfaces S2 of the cavity C, and an upper surface of the insulation layer 35 is formed to be flat.

Since the first semiconductor chip 40 is arranged in the cavity C with high-position accuracy, an interval between the first semiconductor chip 40 and the inner wall surface S1 of the cavity C is not excessively narrowed. Therefore, when forming the insulation layer 35 for embedding therein the first semiconductor chip 40, a void is prevented from being generated.

Also, since an interval between the first semiconductor chip 40 and the inclined inner wall surface S2 of the cavity C increases, it is possible to further reliably fill the insulation layer 35.

When forming the uncured resin film to form the insulation layer 35, the resin film is preferably bonded from the inclined inner wall surfaces S2 of the cavity C toward the protrusions 34a.

Referring to the partially enlarged view of FIG. 13, a resin film is bonded from the inclined inner wall surfaces S2-side of the cavity C of the wiring member 1a toward the inner wall surfaces S1 having the protrusions 34a of the cavity C (refer to an arrow).

Thereby, when bonding the resin film, the first semiconductor chip 40 is applied with a force of pushing the same toward the protrusions 34a of the cavity C. However, since the first semiconductor chip 40 is in contact with the protrusions 34a, there is no concern that the first semiconductor chip 40 is to be moved and to be thus positionally misaligned when bonding the resin film.

Figure 16:
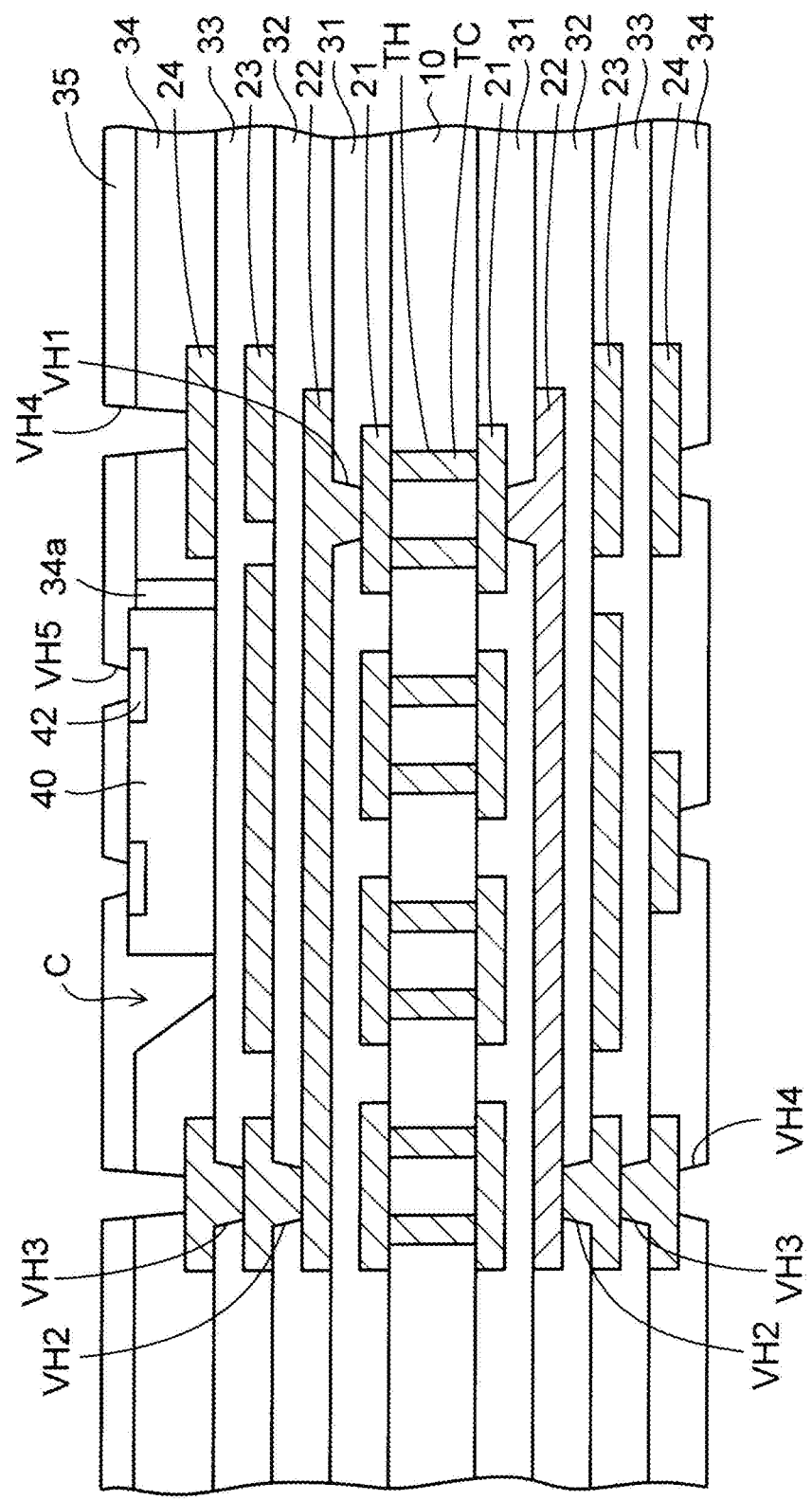
FIG. 16 is a sectional view depicting the manufacturing method of the electronic component-embedded substrate in accordance with the exemplary embodiment (12 thereof)

Then, as shown in FIG. 16, the insulation layer 35 and the insulation layer 34 are subjected to the laser processing, so that via holes VH4 reaching the wiring layer 24 are formed. Also, the insulation layer 35 is subjected to the laser processing, so that via holes VH5 reaching the connection terminals 42 of the first semiconductor chip 40 are formed.

The via hole VH5 on the first semiconductor chip 40 is an example of the first via hole, and the via hole VH4 on the wiring layer 24 is an example of the second via hole.

Also, the insulation layer 34 provided at the lower surface of the core substrate 10 is formed with via holes VH4 reaching the wiring layer 24.

Subsequently, as shown in FIG. 17, a wiring layer 25 is formed on the insulation layer 35 provided at the upper surface. The wiring layer 25 is connected to the wiring layer 24 through via-conductors in the via holes VH4. Also, the wiring layer 25 is connected to the connection terminals 42 of the first semiconductor chip 40 through via-conductors in the via holes VH5.

The wiring layer 25 has first pads P1 arranged immediately above the connection terminals 42 of the first semiconductor chip 40 and second pads P2 connected to the lower wiring layer 24.

As described above, the first semiconductor chip 40 is contacted to the protrusions 34a of the cavity C, so that it is arranged in the cavity C with high-position accuracy.

Thereby, the first pads P1 (the via holes VH5) connected to the connection terminals 42 of the first semiconductor chip 40 and the second pads P2 (the via holes VH4) connected to the wiring layer 24 arranged in the lateral region of the first semiconductor chip 40 are arranged with high-position accuracy.

Also, a wiring layer 25 to be connected to the wiring layer 24 through via-conductors in the via holes VH4 is formed on the insulation layer 34 provided at the lower surface.

Then, as shown in FIG. 18, a solder resist layer 36 having openings 36a formed on the first pads P1 and the second pads P2 is formed on the insulation layer 35 provided at the upper surface.

Also, similarly, a solder resist layer 37 having openings 37a formed on the connection portions of the wiring layer 25 is formed on the insulation layer 34 provided at the lower surface. By the above processes, an electronic component-embedded substrate 1 of the exemplary embodiment is manufactured.

Subsequently, a method of establishing an electronic component device by using the electronic component-embedded substrate 1 of FIG. 18 is described.

As shown in FIG. 19, a second semiconductor chip 60 having connection terminals 62 provided at a lower surface is prepared. Then, the connection terminals 62 of the second semiconductor chip 60 are flip chip-connected to the first pads P1 and the second pads P2 of the electronic component-embedded substrate 1 by bump electrodes 63 such as solders. The second semiconductor chip 60 is an example of the second electronic component.

At this time, as described above, the first pads P1 and the second pads P2 of the electronic component-embedded substrate 1 are arranged with high-precision accuracy so as to correspond to the connection terminals 62 of the second semiconductor chip 60. For this reason, it is possible to reliably connect the connection terminals 62 of the second semiconductor chip 60 to the first pads P1 and the second pads P2.

Also, an under-fill resin 64 is filled between the second semiconductor chip 60 and the electronic component-embedded substrate 1.

Then, as shown in FIG. 20, the structure of FIG. 19 is cut so as to obtain each of the product regions R, and solder balls are mounted to the connection portions of the wiring layer 25 provided at the lower surface, so that external connection terminals T are formed. By the above processes, an electronic component device 2 of the exemplary embodiment is obtained.

As shown in FIG. 20, the second semiconductor chip 60 is connected to the electronic component-embedded substrate 1, so that the electronic component device 2 is established. The electronic component-embedded substrate 1 has the wiring member 1a shown in FIG. 4. The insulation layer 34 of the wiring member 1a is formed with the cavity C having a quadrangular shape, as seen from above. The insulation layer 34 is an example of the first insulation layer.

As described above with reference to FIG. 6, the cavity C has the two adjacent inner wall surfaces S1 and the protrusions 34a protruding inward from the inner wall surfaces S2. Also, the cavity C has the two adjacent inclined inner wall surfaces 52 provided at the opposite sides to the two inner wall surfaces S1 and inclined inward and downward.

The first semiconductor chip 40 (first electronic component) is arranged in the cavity C, and is in contact with the protrusions 34a formed on the inner wall surfaces S1 of the cavity C.

In this way, the positional deviation that is to occur when mounting the first semiconductor chip 40 is cancelled, and the first semiconductor chip 40 is arranged in the cavity C with high-position accuracy.

In the wiring member 1a, a part of the wiring layer 24 of the multi-layered wiring layer is formed in the lateral region of the first semiconductor chip 40, and the wiring layer 24 is covered with the insulation layer 34.

Also, the insulation layer 35 is formed on the insulation layer 34 and the first semiconductor chip 40. The insulation layer 35 is an example of the second insulation layer.

Also, the via holes VH5 reaching the connection terminals 42 of the first semiconductor chip 40 are formed in the insulation layer 35. The via hole VH5 is an example of the first via hole. Also, the via holes VH4 reaching the wiring layer 24 are formed in the insulation layer 35 and the insulation layer 34. The via hole VH4 is an example of the second via hole.

The first pads P1 connected to the connection terminals 42 of the first semiconductor chip 40 through the via-conductors in the via holes VH5 are formed on the insulation layer 35. Also, the second pads P2 connected to the wiring layer 24 through the via-conductors in the via holes VH4 are formed on the insulation layer 35.

Also, the solder resist layer 36 having the openings 36a formed on the first pads P1 and the second pads P2 is formed on the insulation layer 35.

At the lower surface of the wiring member 1a, the insulation layer 34 is formed with the via holes VH4 reaching the connection portions of the wiring layer 24. The lower surface of the insulation layer 34 is formed with the wiring layer 25 connected to the wiring layer 24 through the via-conductors in the via holes VH4.

Also, the lower surface of the insulation layer 34 is formed with the solder resist layer 37 having the openings 37a provided on the connection portions of the wiring layer 25. The wiring layer 25 in the openings 37a of the solder resist layer 37 is formed with the external connection terminals T. In this way, the electronic component-embedded substrate 1 of the exemplary embodiment is established.

Also, the connection terminals 62 of the second semiconductor chip 60 (the second electronic component) are flip chip-connected to the first pads P1 and the second pads P2 of the electronic component-embedded substrate 1 by the bump electrodes 63. Also, the under-fill resin 64 is filled between the second semiconductor chip 60 and the electronic component-embedded substrate 1. Thereby, the electronic component device 2 of the exemplary embodiment is established.

As described above, in the electronic component-embedded substrate 1 of the exemplary embodiment, the cavity C has the two adjacent inner wall surfaces S1 having the protrusions 34a formed thereon and the two adjacent inclined inner wall surfaces S2 arranged at the opposite sides.

The inclined inner wall surfaces S2 of the cavity C are formed so as to easily mount the first semiconductor chip 40.

The first semiconductor chip 40 is positionally determined with being in contact with the protrusions 34a of the cavity C.

Thereby, the positional deviation amount of the first semiconductor chip 40 from the design specification depends on only the processing precision when subjecting the insulation layer 34 to the laser processing to form the protrusions 34a of the cavity C and is thus suppressed to be small.

Therefore, the position accuracy of the first pads P1 (the via holes VH5) to be connected to the connection terminals 42 of the first semiconductor chip 40 is equivalent to the second pads P2 (the via holes VH4) connected to the wiring layer 24 arranged in the lateral region of the first semiconductor chip 40, so that the mutual positions are matched.

Thereby, it is possible to reliably connect the connection terminals 62 of the second semiconductor chip 60 to the first pads P1 and the second pads P2 of the electronic component-embedded substrate 1, so that it is possible to improve the reliability of the electronic component device 2.

Also, when manufacturing the electronic component-embedded substrate 1 and the electronic component device 2 by using a large-scaled substrate for multiple formation, it is possible to improve the manufacturing yield and to save the cost.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

Figure 21:
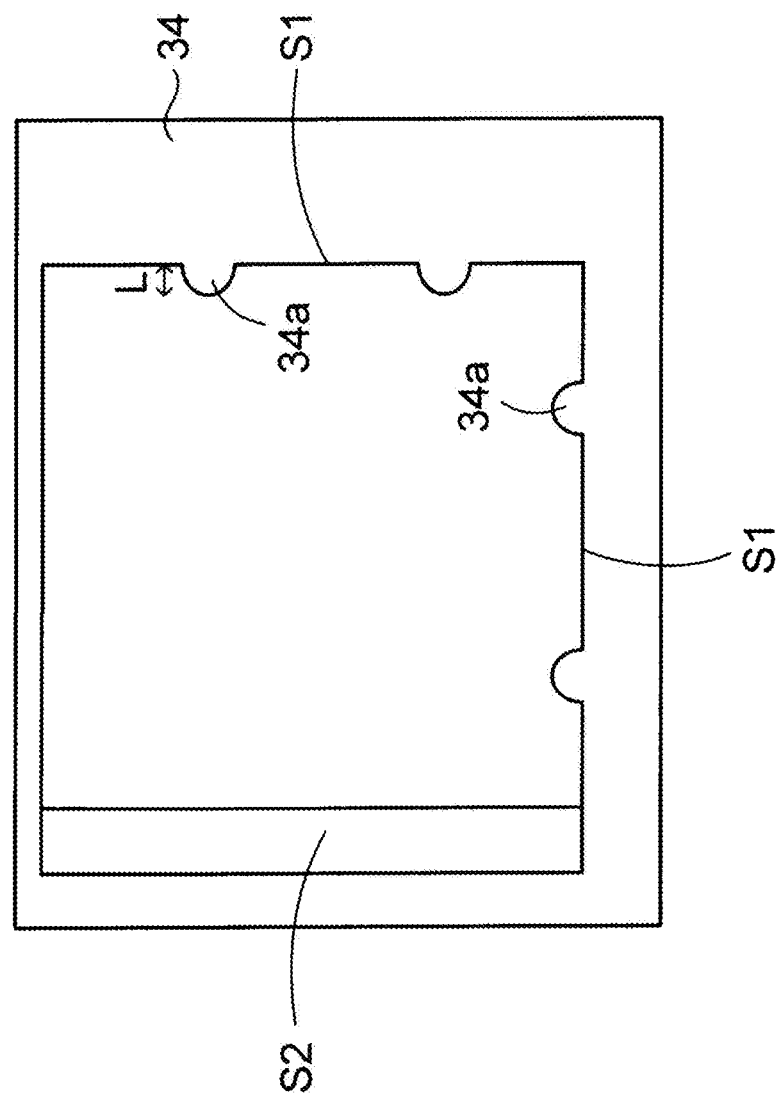
FIG. 21 is a sectional view depicting a modified example of the cavity of the electronic component-embedded substrate.

In the exemplary embodiment, the cavity C has two adjacent inclined inner wall surfaces S2 at opposite sides to the two inner wall surfaces S1 having the protrusions 34a formed thereon. However, as shown in FIG. 21, the cavity C may have one inclined inner wall surface S2 at an opposite side to one of the two inner wall surfaces S1 having the protrusions 34a formed thereon. Further, in the exemplary embodiment, the protrusions 34a are separately formed at two portions of each of the two inner wall surfaces S1. However, one protrusion 34a may be formed at one of the two inner wall surfaces S1 and two protrusions 34a may be separately formed at two portions of the other of the two inner wall surfaces S1. In this case, the protrusion 34a is preferably formed at the center portion of the one of the two inner wall surfaces S1, so that the semiconductor chip can be stably positioned.

This disclosure further encompasses various exemplary embodiments, for example, described below.

1. A method of manufacturing an electronic component-embedded substrate, the method comprising:
preparing a wiring member having a first insulation layer;
forming a quadrangular cavity in the first insulation layer, the cavity having two adjacent inner wall surfaces, protrusions protruding inward from the two inner wall surfaces, respectively, and two adjacent inclined inner wall surfaces arranged at opposite sides to the two inner wall surfaces and inclined inward and downward, and
after the forming the cavity,
arranging an electronic component in the cavity; and
bringing the electronic component into contact with the protrusions of the cavity by tilting the wiring member.

2. The method according to claim 1, wherein in the preparing the wiring member, the wiring member has a wiring layer formed in a lateral region of a part in which the cavity is formed, and covered with the first insulation layer, and
wherein after the bringing the electronic component into contact with the protrusions of the cavity, the method comprising:
forming a second insulation layer on the first insulation layer and the electronic component,
forming a first via hole reaching a connection terminal of the electronic component in the second insulation layer and forming a second via hole reaching the wiring layer in the second insulation layer and the first insulation layer; and
forming, on the second insulation layer, a first pad to be connected to the connection terminal of the electronic component through the first via hole and a second pad to be connected to the wiring layer through the second via hole.

3. The method according to claim 2, wherein in the forming the second insulation layer, a resin film is bonded from the inclined inner wall surfaces of the cavity toward the protrusions.

4. The method according to one of claims 1 to 3, wherein the inclined inner wall surfaces of the cavity are formed by subjecting the first insulation layer to laser processing, and
wherein laser is irradiated with being defocused with respect to a surface of the first insulation layer, so that the inclined inner wall surfaces are formed.

5. The method according to one of claims 1 to 4, wherein in the forming the cavity, each of the protrusions is formed to have a semicircular column shape and to have the same height as each of the inner wall surfaces of the cavity.

What is claimed is:

1. An electronic component-embedded substrate comprising:
a first insulation layer having a quadrangular cavity formed therein; and
an electronic component arranged in the cavity,
wherein the cavity has:
two adjacent first inner wall surfaces,
protrusions protruding inward from the two first inner wall surfaces, respectively, and
at least one second inner wall surface arranged at an opposite side to one of the two first inner wall surfaces and inclined downward from an outer side toward an inner side,
wherein the electronic component is in contact with the protrusions of the cavity, and
wherein the at least one second inner wall surface does not have a protrusion formed thereon.

2. The electronic component-embedded substrate according to claim 1, further comprising:
a wiring layer arranged in a lateral region of the electronic component and covered with the first insulation layer,
a second insulation layer formed on the first insulation layer and the electronic component,
a first via hole formed in the second insulation layer and reaching a connection terminal of the electronic component,
a second via hole formed in the second insulation layer and the first insulation layer and reaching the wiring layer,
a first pad formed on the second insulation layer and connected to the connection terminal of the electronic component through the first via hole, and a second pad formed on the second insulation layer and connected to the wiring layer through the second via hole.

3. The electronic component-embedded substrate according to claim 1, wherein each of the protrusions has a semicircular column shape and has the same height as each of the first inner wall surfaces of the cavity.

4. The electronic component-embedded substrate according to claim 1, wherein the protrusions are separately formed at two places on each of the two first inner wall surfaces.

5. The electronic component-embedded substrate according to claim 1, wherein the electronic component-embedded substrate comprises two adjacent second inner wall surfaces arranged at opposite sides to the two first inner wall surfaces and inclined downward from an outer side toward an inner side.

6. An electronic component device comprising:
an electronic component-embedded substrate including
    a first insulation layer having a quadrangular cavity formed therein;
    a first electronic component arranged in the cavity;
    a wiring layer arranged in a lateral region of the first electronic component and covered with the first insulation layer;
    a second insulation layer formed on the first insulation layer and the first electronic component;
    a first via hole formed in the second insulation layer and reaching a connection terminal of the first electronic component,
    a second via hole formed in the second insulation layer and the first insulation layer and reaching the wiring layer,
    a first pad formed on the second insulation layer and connected to the connection terminal of the first electronic component through the first via hole, and
    a second pad formed on the second insulation layer and connected to the wiring layer through the second via hole; and
a second electronic component connected to the first pad and the second pad of the electronic component-embedded substrate,
wherein the cavity has:
    two adjacent first inner wall surfaces,
    protrusions protruding inward from the two first inner wall surfaces, respectively, and
    at least one second inner wall surface arranged at an opposite side to one of the two first inner wall surfaces and inclined downward from an outer side toward an inner side,
wherein the first electronic component is in contact with the protrusions of the cavity, and
wherein the at least one second inner wall surface does not have a protrusion formed thereon.

* * * * *